US012699473B2

(12) United States Patent
Lee et al.

(10) Patent No.: US 12,699,473 B2
(45) Date of Patent: Aug. 4, 2026

(54) ELECTRONIC DEVICE

(71) Applicant: AUO Corporation, Hsinchu City (TW)

(72) Inventors: Chih-Tsung Lee, Hsinchu City (TW);
Chih-Hung Wu, Hsinchu City (TW);
Wei Ting Liu, Hsinchu City (TW);
Chih-Yu Yu, Hsinchu City (TW);
Yen-Huei Lai, Hsinchu City (TW);
Wan-Tsang Wang, Hsinchu City (TW)

(73) Assignee: AUO Corporation, Hsinchu City (TW)

( * ) Notice: Subject to any disclaimer, the term of this patent is extended or adjusted under 35 U.S.C. 154(b) by 0 days.

(21) Appl. No.: 19/239,846

(22) Filed: Jun. 16, 2025

(65) Prior Publication Data

US 2026/0186593 A1 Jul. 2, 2026

(30) Foreign Application Priority Data

Dec. 31, 2024 (TW) ................................. 113151647

(51) Int. Cl.
*G06F 3/041* (2006.01)
*G06F 3/044* (2006.01)
*H10H 29/14* (2025.01)
(52) U.S. Cl.
CPC ............ *G06F 3/0412* (2013.01); *G06F 3/044* (2013.01); *G06F 2203/04102* (2013.01); *H10H 29/142* (2025.01)

(58) Field of Classification Search
None
See application file for complete search history.

(56) References Cited

U.S. PATENT DOCUMENTS

| | | | | |
|---|---|---|---|---|
| 2017/0344788 A1* | 11/2017 | Lee | ...................... | G06V 40/13 |
| 2022/0206619 A1 | 6/2022 | Kim et al. | | |
| 2024/0006565 A1 | 1/2024 | Zhang et al. | | |

FOREIGN PATENT DOCUMENTS

| | | |
|---|---|---|
| CN | 113602035 A | 11/2021 |
| CN | 216527118 | 5/2022 |
| CN | 115084108 A | 9/2022 |
| CN | 117479721 | 1/2024 |
| EP | 3776674 | 7/2024 |
| JP | 2022105300 | 7/2022 |
| TW | 202013768 | 4/2020 |
| TW | I812938 | 8/2023 |

* cited by examiner

*Primary Examiner* — Nicholas J Lee
(74) *Attorney, Agent, or Firm* — JCIPRNET

(57) ABSTRACT

An electronic device includes a stretchable electronic component layer and a decorative component layer. The decorative component layer includes a first sub-layer and a second sub-layer. The first sub-layer is disposed on the stretchable electronic component layer. The second sub-layer is disposed on the first sub-layer. The first sub-layer is located between the second sub-layer and the stretchable electronic component layer. The second sub-layer has a decorative texture. A transmittance of the first sub-layer is less than a transmittance of the second sub-layer.

17 Claims, 26 Drawing Sheets

10

10D 110,160

140

10G

10H

101

10l

ELECTRONIC DEVICE

CROSS-REFERENCE TO RELATED APPLICATION

This application claims the priority benefit of Taiwan application serial no. 113151647, filed on Dec. 31, 2024. The entirety of the above-mentioned patent application is hereby incorporated by reference herein and made a part of this specification.

BACKGROUND

Technical Field

The disclosure relates to an electronic device.

Related Art

As the development of electronic technology reaches new high, electronic products are constantly being updated. In order to apply electronic products to various fields, characteristics such as stretchability, thinness, and being free of restriction in shape are gradually gaining attention. That is to say, electronic products are required to have different shapes according to different applications and environments. Therefore, electronic products need to be stretchable. However, when stretched, electronic products may have problems such as bonding failure and irregular warping due to stress. In addition, stretchable electronic products often have decorative textures on the surfaces, but the existence of decorative textures may result in patches in the display, which seriously affects the display quality.

SUMMARY

The disclosure provides an electronic device with favorable characteristics.

The electronic device according to an embodiment of the disclosure includes a stretchable electronic component layer and a decorative component layer. The decorative component layer includes a first sub-layer and a second sub-layer. The first sub-layer is disposed on the stretchable electronic component layer. The second sub-layer is disposed on the first sub-layer. The first sub-layer is located between the second sub-layer and the stretchable electronic component layer. The second sub-layer has a decorative texture. A transmittance of the first sub-layer is less than a transmittance of the second sub-layer.

DESCRIPTION OF THE EMBODIMENTS

Figure 1:
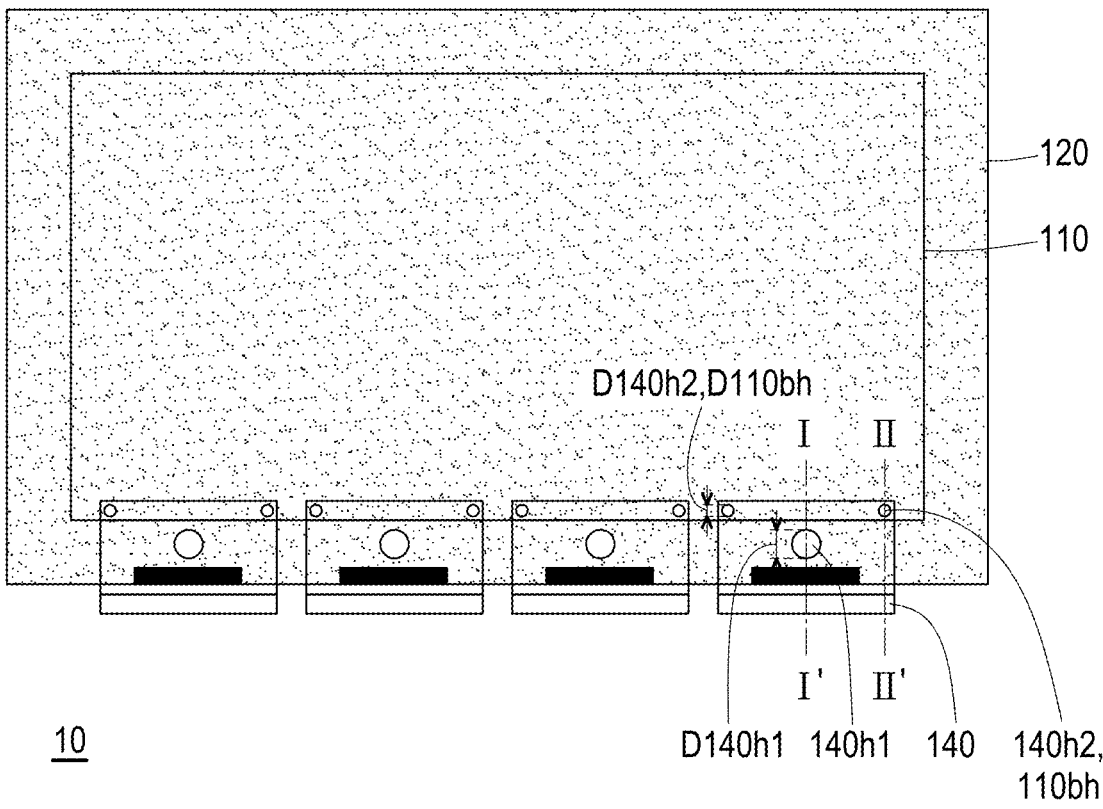
FIG. 1 is a top view of an electronic device according to an embodiment of the disclosure with the internal structure visible.

Exemplary embodiments of the disclosure will be described in detail hereinafter, examples of which are illustrated in the accompanying drawings. Wherever possible, the same reference numerals are used in the drawings and descriptions to represent the same or similar parts.

It should be understood that when an element such as a layer, film, area, or substrate is described as being "on" or "connected to" another element, the element may be directly on or connected to the another element, or there may be intervening elements therebetween. On the other hand, when an element is described as being "directly on" or "directly connected to" another element, no intervening element is present. As used herein, "connection" may refer to physical and/or electrical connection. Furthermore, "electrical connection" or "coupling" may mean that there are other elements between two elements.

The terms "about," "approximately," and "substantially" as used herein include the stated value and the average values within an acceptable deviation range for a particular value as determined by those skilled in the art, considering the measurement in question and the particular number of errors associated with the measurement (that is, limitations of the measurement system). For example, "about" may mean being within one or more standard deviations of the stated value, or within ±30%, ±20%, ±10%, or ±5%. Furthermore, in regard to the terms "about," "approximately," and "substantially" as used herein, a more acceptable deviation range or standard deviation may be selected according to optical properties, etching properties, or other properties, and it is not necessary to use one standard deviation for all properties.

Unless otherwise defined, all the terms (including technical and scientific terms) used herein have the same meanings as commonly understood by those skilled in the art to which the disclosure belongs. It should also be understood that terms, such as those defined in commonly used dictionaries, are interpreted as having consistent meanings in the related art and in the context of the disclosure, and will not be interpreted in an idealized or overly formal sense unless expressly so defined herein.

Figure 2:
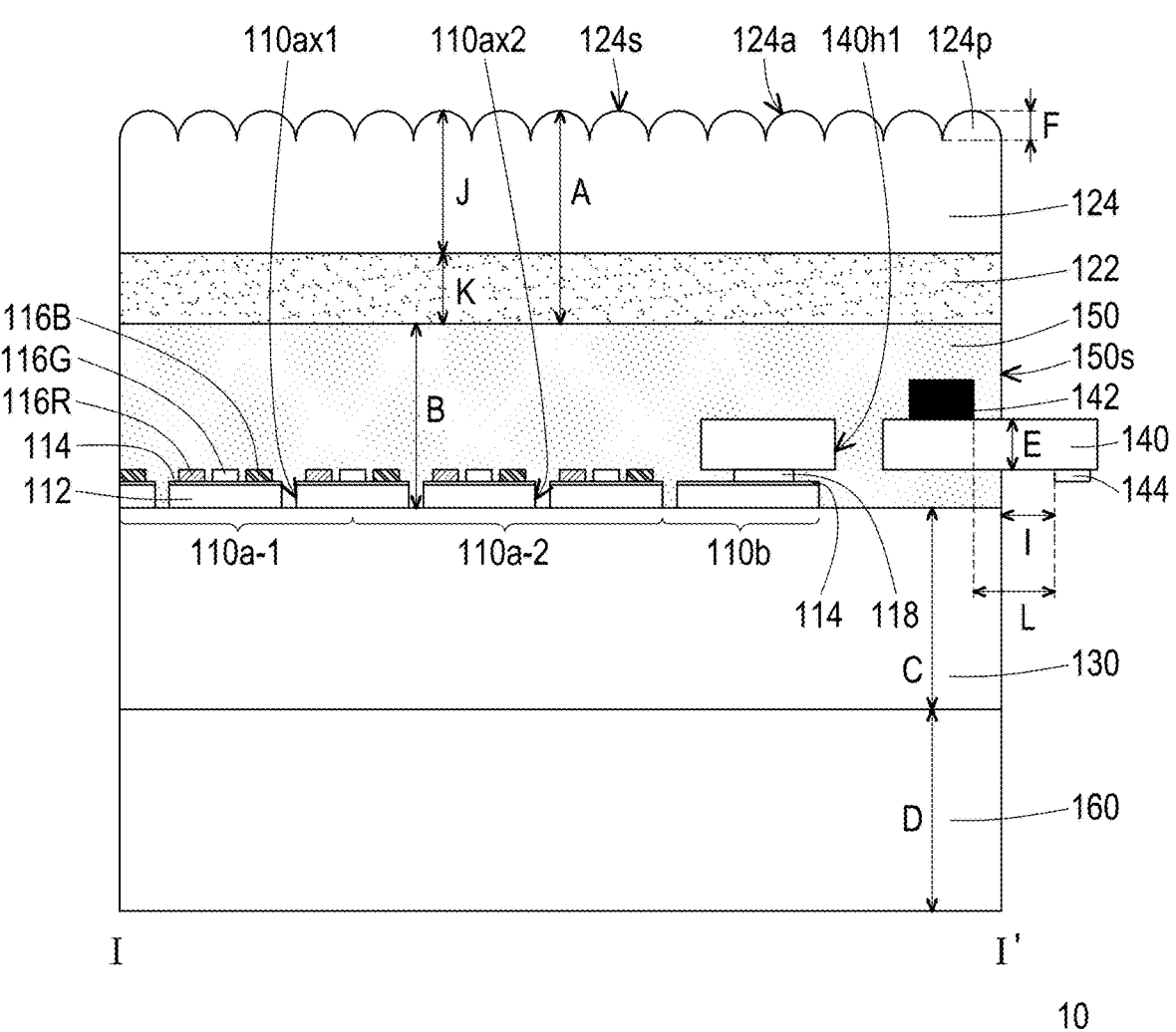
FIG. 2 is a cross-sectional view of an electronic device according to an embodiment of the disclosure.

FIG. 1 is a top view of an electronic device according to an embodiment of the disclosure with the internal structure visible. FIG. 2 is a cross-sectional view of an electronic device according to an embodiment of the disclosure. FIG. 2 corresponds to the cross-section line I-I' in FIG. 1.

Referring to FIG. 1 and FIG. 2, an electronic device 10 includes a stretchable electronic component layer 110. In some embodiments, the stretchable electronic component layer 110 includes a stretchable substrate 112, a driving circuit layer 114 disposed on the stretchable substrate 112, and multiple pixel structures 116 electrically connected to the driving circuit layer 114. In some embodiments, each pixel structure 116 may include multiple light-emitting elements 116R, 116G, and 116B. In some embodiments, the light-emitting elements 116R, 116G, and 116B are, for example, micro light-emitting diodes (μLED), but the disclosure is not limited thereto. In some embodiments, the stretchable electronic component layer 110 may be a stretchable display layer. However, the disclosure is not limited thereto. In other embodiments, the stretchable electronic component layer 110 may be other types of stretchable component layers, or a combination of other types of stretchable component layers with a stretchable display layer.

In some embodiments, the material of the stretchable substrate 112 may be selected from organic polymers, such as polyimide (PI), polyethylene naphthalate (PEN), polyethylene terephthalate (PET), polycarbonates (PC), polyether sulfone (PES) or polyarylate, other suitable materials, or a combination of at least two of the aforementioned materials, but the disclosure is not limited thereto.

Referring to FIG. 2, in some embodiments, the stretchable electronic component layer 110 includes a working area 110a and a bonding area 110b outside the working area 110a. The bonding area 110b of the stretchable electronic component layer 110 includes a pad 118, and the pad 118 is electrically connected to the driving circuit layer 114. In some embodiments, the working area 110a of the stretchable electronic component layer 110 may selectively include a low stretch working area 110a-1 and a high stretch working area 110a-2. The strain of the high stretch working area 110a-2 is greater than the strain of the low stretch working area 110a-1. For example, in some embodiments, the strain of the high stretch working area 110a-2 may be less than 50%, and the strain of the low stretch working area 110a-1 may be less than 6%, but the disclosure is not limited thereto.

In some embodiments, the high stretch working area 110a-2 may be located between the low stretch working area 110a-1 and the bonding area 110b. That is, the high stretch working area 110a-2 may be closer to the bonding area 110b, while the low stretch working area 110a-1 may be farther from the bonding area 110b. However, the disclosure is not limited thereto, and the relative positions of the low stretch working area 110a-1, the high stretch working area 110a-2, and the bonding area 110b may be determined based on the state of bending desired for the electronic device 10. The disclosure is not intended to impose any limitation.

Figure 3:
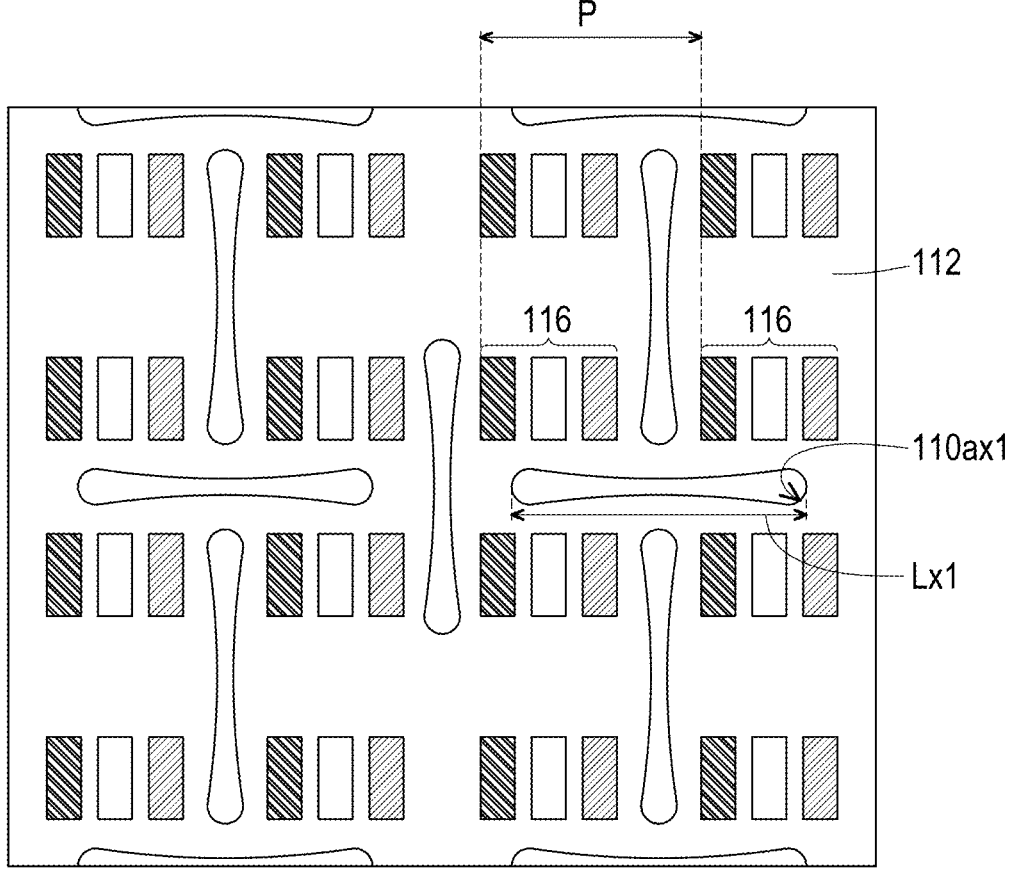
FIG. 3 is a top view of a low stretch working area of a stretchable electronic component layer according to an embodiment of the disclosure.
Figure 4:
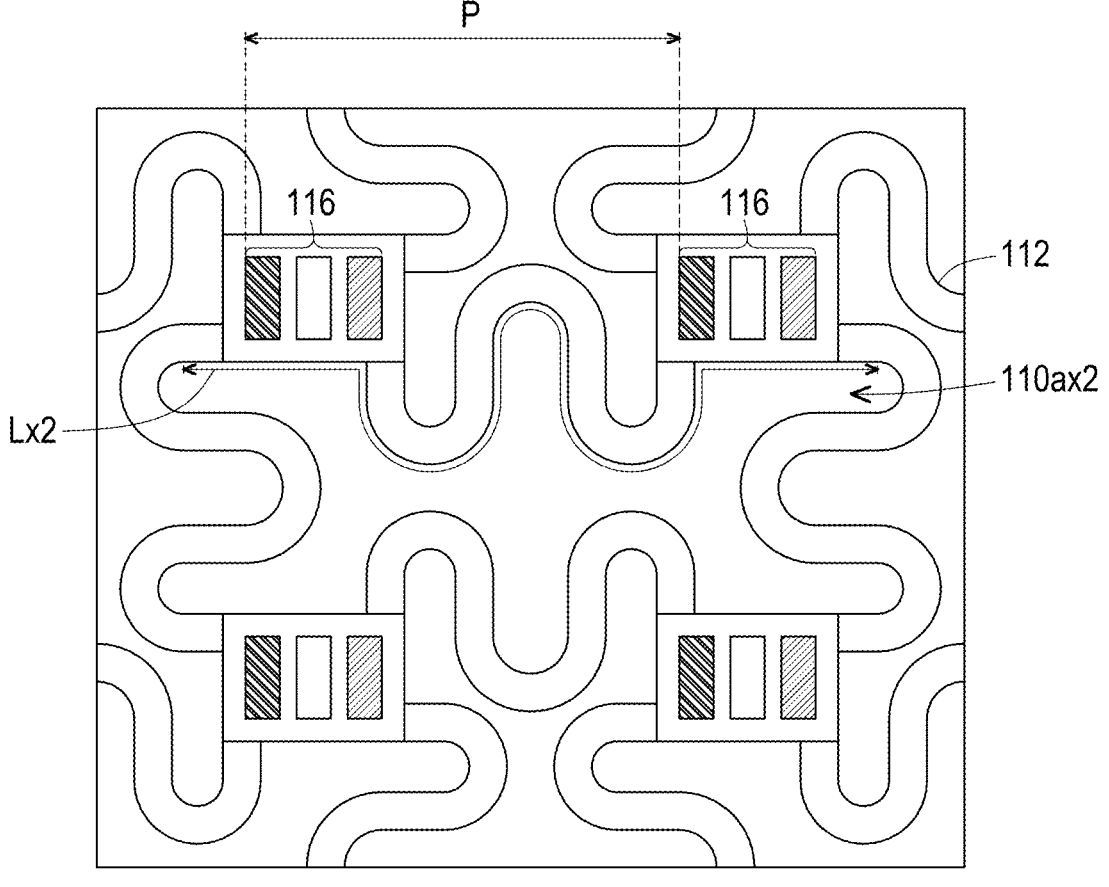
FIG. 4 is a top view of a high stretch working area of a stretchable electronic component layer according to an embodiment of the disclosure.

FIG. 3 is a top view of a low stretch working area of a stretchable electronic component layer according to an embodiment of the disclosure. FIG. 4 is a top view of a high stretch working area of a stretchable electronic component layer according to an embodiment of the disclosure. Referring to FIG. 2, FIG. 3, and FIG. 4, in some embodiments, the working area 110a of the stretchable electronic component layer 110 has working area perforations 110ax1 and 110ax2. In some embodiments, the shape of the working area perforation 110ax1 in the low stretch working area 110a-1 may be different from the shape of the working area perforation 110ax2 in the high stretch working area 110a-2. For example, in some embodiments, the working area perforation 110ax1 in the low stretch working area 110a-1 may generally be in a strip shape, while the working area perforation 110ax2 in the high stretch working area 110a-2 may be in an irregular shape. In some embodiments, a side length Lx2 of the working area perforation 110ax2 in the high stretch working area 110a-2 may be greater than a side length Lx1 of the working area perforation 110ax1 in the low stretch working area 110a-1. For example, in some embodiments, the side length Lx2 of the working area perforation 110ax2 in the high stretch working area 110a-2 is approximately 2 times or more a distance P between two adjacent pixel structures 116, while the side length Lx1 of the working area perforation 110ax1 in the low stretch working area 110a-1 is approximately 1.5 times the distance P between two adjacent pixel structures 116, but the disclosure is not limited thereto.

Referring to FIG. 1 and FIG. 2, in some embodiments, the decorative component layer 120 includes a first sub-layer 122 and a second sub-layer 124. The first sub-layer 122 is disposed on the stretchable electronic component layer 110, and the second sub-layer 124 is disposed on the first sub-layer 122. The first sub-layer 122 is located between the second sub-layer 124 and the stretchable electronic component layer 110, and the second sub-layer 124 has a decorative texture 124a. The decorative texture 124a may provide tactile sensation. For example, in some embodiments, the decorative texture 124a may be leather texture, fabric texture, or other textures. In some embodiments, considering the need to provide tactile sensation, the second sub-layer 124 may have haze. The magnitude of the haze may be determined based on the desired tactile and/or visual effect, and the disclosure is not intended to impose any limitation. For example, if a matte texture effect is desired, the haze of the second sub-layer 124 may fall in a range of 10% to 50%; if a leather texture effect is desired, the haze of the second sub-layer 124 may fall in a range of 60% to 90%, but the disclosure is not limited thereto. Additionally, in some embodiments, without excessively affecting optical performance, the second sub-layer 124 with the decorative texture 124a may selectively include a hardening agent to adjust the hardness and surface tactile sensation.

It is worth noting that the transmittance of the first sub-layer 122 is less than the transmittance of the second sub-layer 124. For example, in some embodiments, the transmittance of the first sub-layer 122 may fall in a range of 10% to 40%, and the transmittance of the second sub-layer 124 is greater than 80%, but the disclosure is not limited thereto. In some embodiments, preferably, the transmittance of the first sub-layer 122 of the decorative component layer 120 falls in a range of 20% to 30%, and the transmittance of the second sub-layer 124 is greater than 92%, to improve the appearance and texture, but the disclosure is not limited thereto.

In some embodiments, the color of the first sub-layer 122 of the decorative component layer 120 may be different from the color of the second sub-layer 124. For example, in some embodiments, the first sub-layer 122 may have a color (for example, but not limited to: gray, black, etc., where gray or black provides better color balance for display), while the second sub-layer 124 may be substantially transparent.

In some embodiments, the first sub-layer 122 has a color, which can adjust the hue. The second sub-layer 124 is substantially transparent, and has the decorative texture 124a, which can provide surface tactile sensation. The first sub-layer 122 may be called a color layer. The second sub-layer 124 may be called a transparent texture layer. By dividing the decorative component layer 120 into a color layer and a transparent texture layer during manufacturing, the visual effect of the electronic device 10 is improved. For example, in some embodiments, the decorative texture 124a is made of a transparent material, and therefore, the thickness difference caused by the decorative texture 124a does not result in color patches, thereby enhancing the visual effect of the electronic device 10.

Referring to FIG. 2, in some embodiments, the electronic device 10 further includes a carrier layer 130. The stretchable electronic component layer 110 is disposed on the carrier layer 130, and the stretchable electronic component layer 110 is located between the decorative component layer 120 and the carrier layer 130. For example, in some embodiments, the main material of the carrier layer 130 may be silicone rubber, and the Young's modulus of the carrier layer 130 may be in a range of 0.5 MPa to 50 MPa. Preferably, the Young's modulus of the carrier layer 130 is in a range of 1 MPa to 10 MPa. In some embodiments, the stretch recovery rate of the carrier layer 130 may be less than 5%. Preferably, the stretch recovery rate of the carrier layer 130 is less than 2%, but the disclosure is not limited thereto.

Referring to FIG. 1 and FIG. 2, in some embodiments, the electronic device 10 further includes a flexible electronic component 140 bonded to the bonding area 110b of the stretchable electronic component layer 110. Specifically, the flexible electronic component 140 is bonded to the pad 118 of the bonding area 110b. For example, in some embodiments, the flexible electronic component 140 may include a chip 142, and the chip 142 may be bonded to the stretchable electronic component layer 110 by Chip On Film (COF). However, the disclosure is not limited thereto, and in other embodiments, the flexible electronic component 140 may be other types of flexible components.

In some embodiments, the electronic device 10 further includes a protective layer 150 disposed on the carrier layer 130 and covering the stretchable electronic component layer 110 and a part of the flexible electronic component 140. The protective layer 150 is located between the decorative component layer 120 and the stretchable electronic component layer 110 and between the decorative component layer 120 and the flexible electronic component 140.

In some embodiments, the protective layer 150 may cover the chip 142 of the flexible electronic component 140. In some embodiments, the flexible electronic component 140 further includes a connector 144. The connector 144 is separated from the chip 142 by a distance L, a sidewall 150s of the protective layer 150 is separated from the connector 144 by a distance l, and l is less than 0.5 times L, but the disclosure is not limited thereto.

In some embodiments, the main material of the decorative component layer 120 may be the same as the material of the protective layer 150, so that the difference in refractive index between the decorative component layer 120 and the protective layer 150 is less than 0.05. For example, in some embodiments, the main material of the decorative component layer 120 and the material of the protective layer 150 may include silicone rubber, but the disclosure is not limited thereto. In some embodiments, the Young's modulus of the decorative component layer 120 and the protective layer 150 may be in a range of 0.5 MPa to 50 MPa. Preferably, the Young's modulus of the decorative component layer 120 and the protective layer 150 is in a range of 1 MPa to 10 MPa, but the disclosure is not limited thereto. In some embodiments, the elongation rate of the decorative component layer 120 and the protective layer 150 may fall in a range of 600% to 800%, but the disclosure is not limited thereto. In some embodiments, the stretch recovery rate of the decorative component layer 120 and the protective layer 150 may be less than 5%. Preferably, the stretch recovery rate of the decorative component layer 120 and the protective layer 150 is less than 2%, but the disclosure is not limited thereto.

In some embodiments, the electronic device 10 further includes a sensing layer 160. The carrier layer 130 is located between the stretchable electronic component layer 110 and the sensing layer 160. In some embodiments, the sensing layer 160 is, for example, a touch sensing layer, but the disclosure is not limited thereto. In some embodiments, the material of the main substrate layer of the sensing layer 160 may be silicone rubber, and the Young's modulus of the sensing layer 160 may be in a range of 0.5 MPa to 50 MPa. Preferably, the Young's modulus of the sensing layer 160 is in a range of 1 MPa to 10 MPa. In some embodiments, the stretch recovery rate of the sensing layer 160 may be less than 5%. Preferably, the stretch recovery rate of the sensing layer 160 is less than 2%, but the disclosure is not limited thereto.

Referring to FIG. 2, the thickness of the first sub-layer 122 of the decorative component layer 120 is K. The thickness of the second sub-layer 124 of the decorative component layer 120 is J. In some embodiments, $K \leq J$. The second sub-layer 124 of the decorative component layer 120 has a surface 124s facing away from the stretchable electronic component layer 110. The decorative texture 124a is formed on the surface 124s. The surface 124s has a height difference F. In some embodiments, $2F \leq J \leq 10F$. The thickness of the protective layer 150 is B. The thickness of the flexible electronic component 140 is E. In some embodiments, $B \geq 2E$. Preferably, the thickness B of the protective layer 150 equals 3E. The thickness of the decorative component layer 120 is A. $A = K + J$. The thickness of the carrier layer 130 is C. In some embodiments, $A \leq B \leq C$. The thickness of the sensing layer 160 is D. In some embodiments, $A \leq B \leq C \leq D$. For example, in some embodiments, $B \geq 300$ μm and $C \geq 300$ μm, and a thicker material is used to protect and suppress arbitrary deformation of the stretchable wiring, but the disclosure is not limited thereto.

Referring to FIG. 1 and FIG. 2, in some embodiments, the flexible electronic component 140 has a first perforation 140h1, and the first perforation 140h1 is located outside the bonding area 110b of the stretchable electronic component layer 110. Specifically, a part of the protective layer 150 fills into the first perforation 140h1 of the flexible electronic component 140 and connects with the carrier layer 130. The part of the protective layer 150 that fills into the first perforation 140h1 of the flexible electronic component 140 provides a positioning/fixing effect, which limits/fixes the relative positions of the flexible electronic component 140, the protective layer 150, and the carrier layer 130.

Referring to FIG. 1, in some embodiments, the shape of the first perforation 140*h*1 may be circular to prevent uneven stress when stretched. In some embodiments, a dimension D140*h*1 of the first perforation 140*h*1 may fall in a range of 2 mm to 10 mm. Preferably, the dimension D140*h*1 of the first perforation 140*h*1 is in a range of 6 mm to 8 mm, but the disclosure is not limited thereto.

Figure 5:
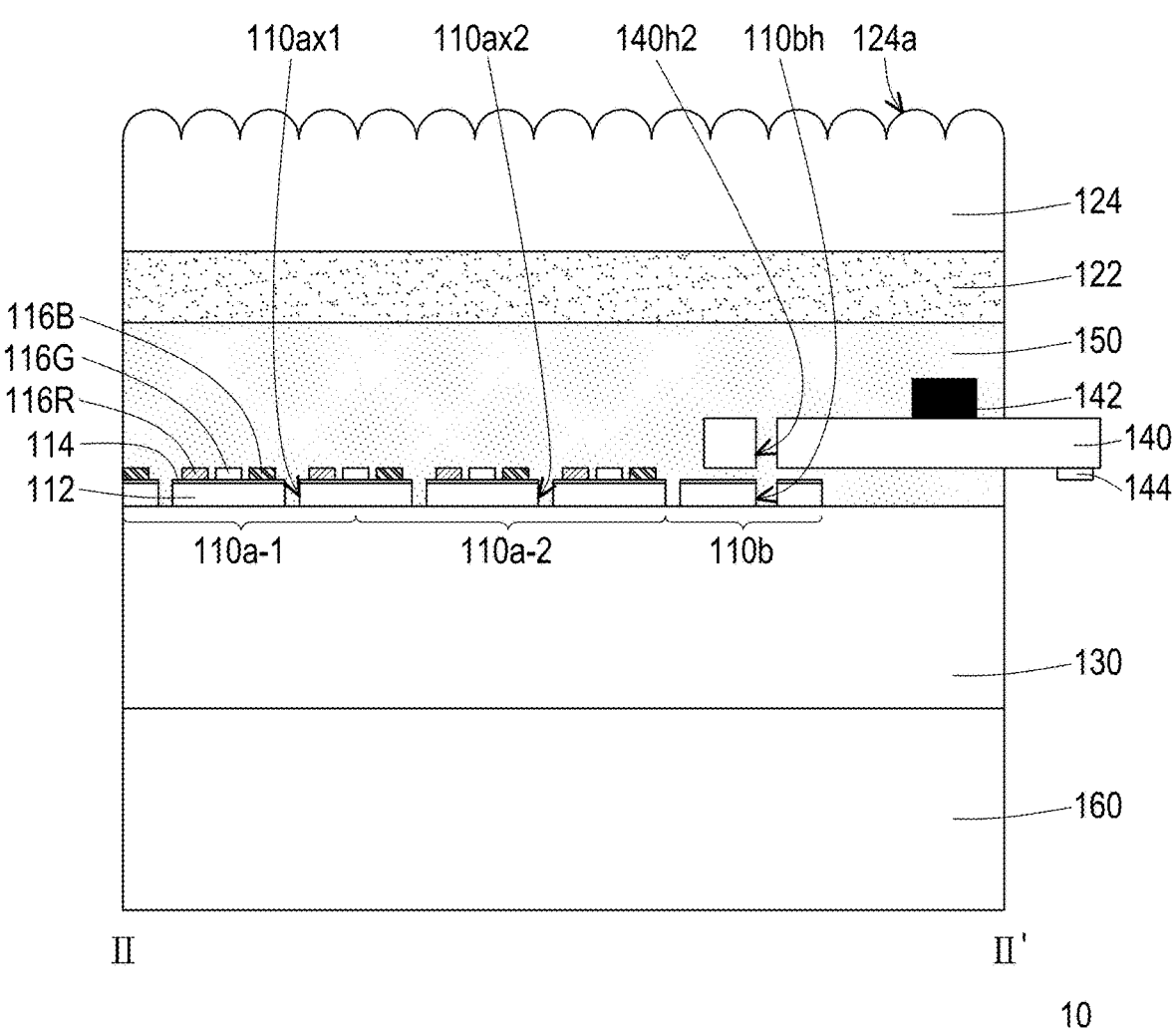
FIG. 5 is a cross-sectional view of an electronic device according to an embodiment of the disclosure.

FIG. 5 is a cross-sectional view of an electronic device according to an embodiment of the disclosure. FIG. 5 corresponds to the cross-section line II-II' in FIG. 1. Referring to FIG. 1 and FIG. 5, in some embodiments, the flexible electronic component 140 has a second perforation 140*h*2, and the bonding area 110*b* of the stretchable electronic component layer 110 has a bonding area perforation 110*bh*. The second perforation 140*h*2 of the flexible electronic component 140 is disposed correspondingly to the bonding area perforation 110*bh* of the stretchable electronic component layer 110. The second perforation 140*h*2 of the flexible electronic component 140 substantially overlaps with the bonding area perforation 110*bh* of the stretchable electronic component layer 110. A part of the protective layer 150 fills into the second perforation 140*h*2 of the flexible electronic component 140 and the bonding area perforation 110*bh* of the stretchable electronic component layer 110, and connects with the carrier layer 130. The part of the protective layer 150 that fills into the second perforation 140*h*2 of the flexible electronic component 140 and the bonding area perforation 110*bh* of the stretchable electronic component layer 110 provides a positioning/fixing effect, which limits/fixes the relative positions of the flexible electronic component 140, the protective layer 150, the stretchable electronic component layer 110, and the carrier layer 130.

Referring to FIG. 1, in some embodiments, the shape of the second perforation 140*h*2/the bonding area perforation 110*bh* may be circular to present uneven stress when stretched. In some embodiments, the dimensions D140*h*2/D110*bh* of the second perforation 140*h*2/the bonding area perforation 110*bh* may fall in a range of 0.1 mm to 2.0 mm. Preferably, the dimensions D140*h*2/D110*bh* of the second perforation 140*h*2/the bonding area perforation 110*bh* are in a range of 0.6 mm to 1.2 mm, but the disclosure is not limited thereto. Referring to FIG. 1 and FIG. 2, in some embodiments, the electronic device 10 may be assembled on a curved surface of a fixture (not shown in FIG. 1 and FIG. 2), and the second perforation 140*h*2 and/or the bonding area perforation 110*bh* may be used to fix the entire electronic device 10 onto the curved surface of the fixture.

Referring to FIG. 2, in some embodiments, a part of the protective layer 150 may fill into the working area perforations 110*ax*1 and 110*ax*2 of the stretchable electronic component layer 110. The part of the protective layer 150 that fills into the working area perforations 110*ax*1 and 110*ax*2 of the stretchable electronic component layer 110 provides a positioning/fixing effect, which limits/fixes the relative positions of the protective layer 150, the stretchable electronic component layer 110, and the carrier layer 130.

Figure 6A:
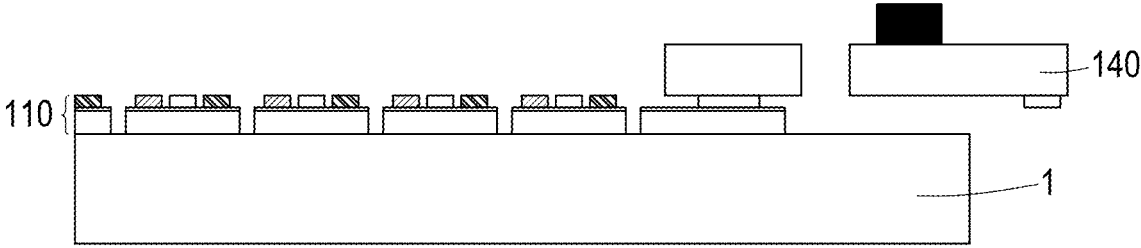
FIG. 6A to FIG. 6G are cross-sectional views of a manufacturing process of an electronic device according to an embodiment of the disclosure.
Figure 6B:
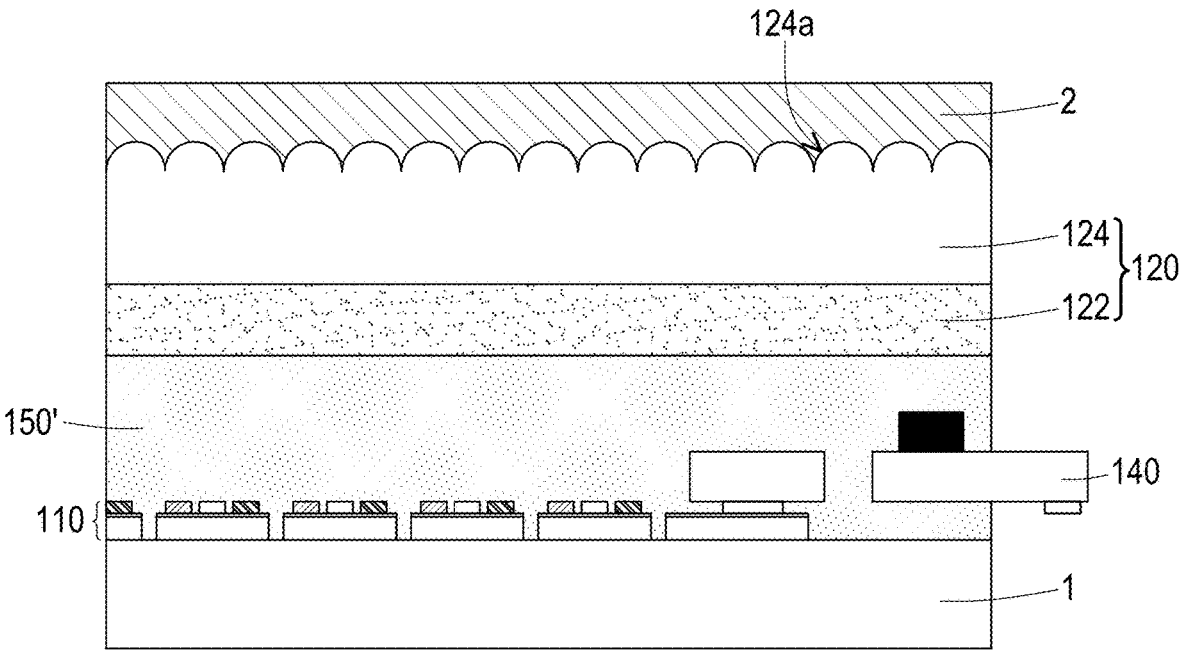

FIG. 6A to FIG. 6G are cross-sectional views of a manufacturing process of an electronic device according to an embodiment of the disclosure. Referring to FIG. 6A, first, the stretchable electronic component layer 110 is formed on a rigid carrier 1, and the flexible electronic component 140 is bonded to the stretchable electronic component layer 110. Referring to FIG. 6B, then, a cured decorative component layer 120 and a texture film 2 used to manufacture the decorative texture 124*a* are laminated with an uncured protective layer 150'. Referring to FIG. 6B, then, the exposed surface of the uncured protective layer 150' is laminated on the stretchable electronic component layer 110 for the material of the uncured protective layer 150' to penetrate into the working area perforations 110*ax*1 and 110*ax*2 and the bonding area perforation 110*bh* of the stretchable electronic component layer 110, and at the same time, the uncured protective layer 150' is squeezed and penetrates into the first perforation 140*h*1 and the second perforation 140*h*2 of the flexible electronic component 140.

Figure 6C:
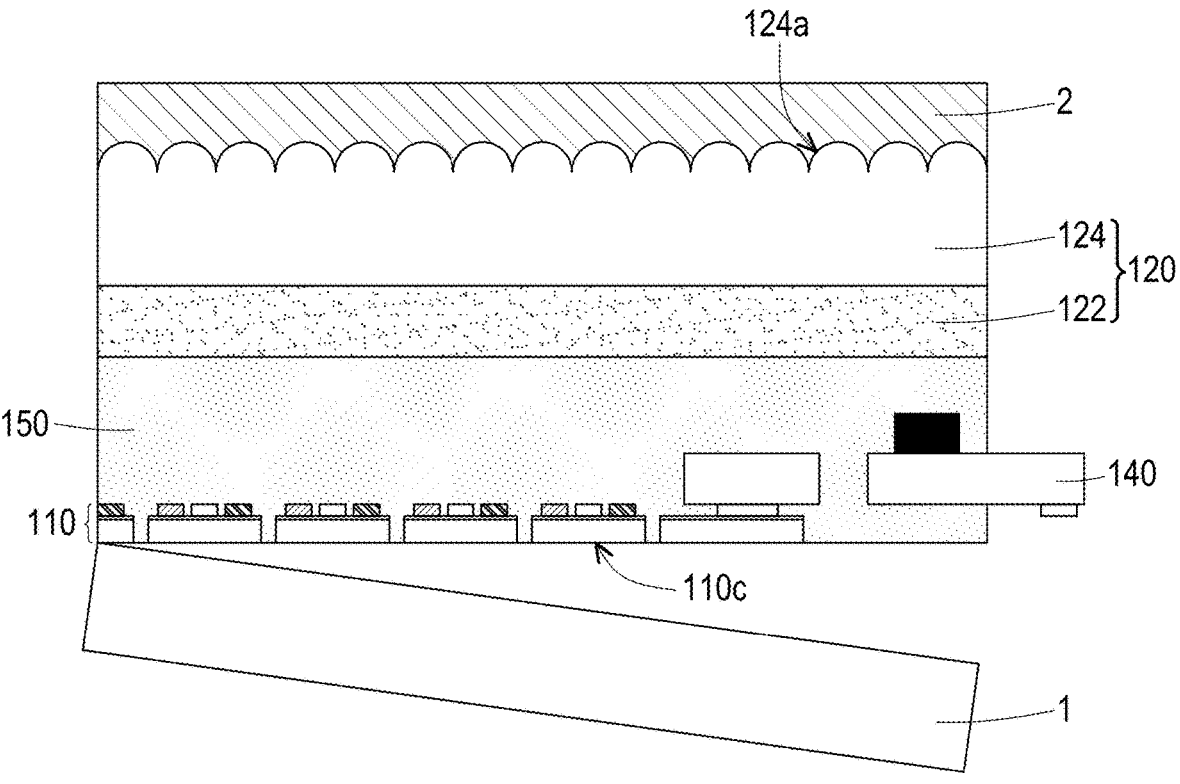

Referring to FIG. 6B and FIG. 6C, then, a heating process is performed to transform the uncured protective layer 150' into a cured protective layer 150, in which the cured protective layer 150 is firmly connected with the decorative component layer 120, the flexible electronic component 140, and the stretchable electronic component layer 110. Referring to FIG. 6C, next, the rigid carrier 1 is separated from the stretchable electronic component layer 110 to expose the surface 110*c* of the stretchable electronic component layer 110.

Figure 6D:
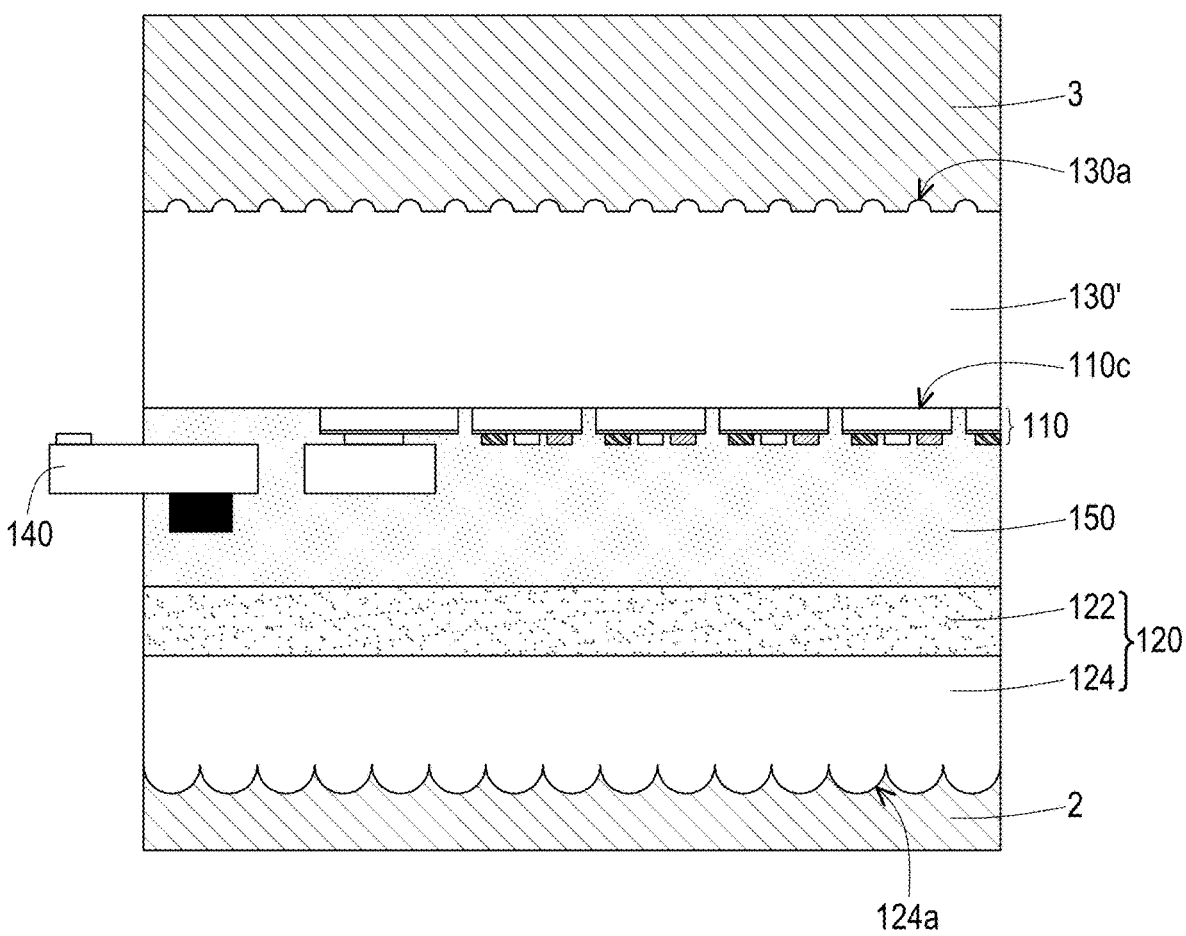
Figure 6E:
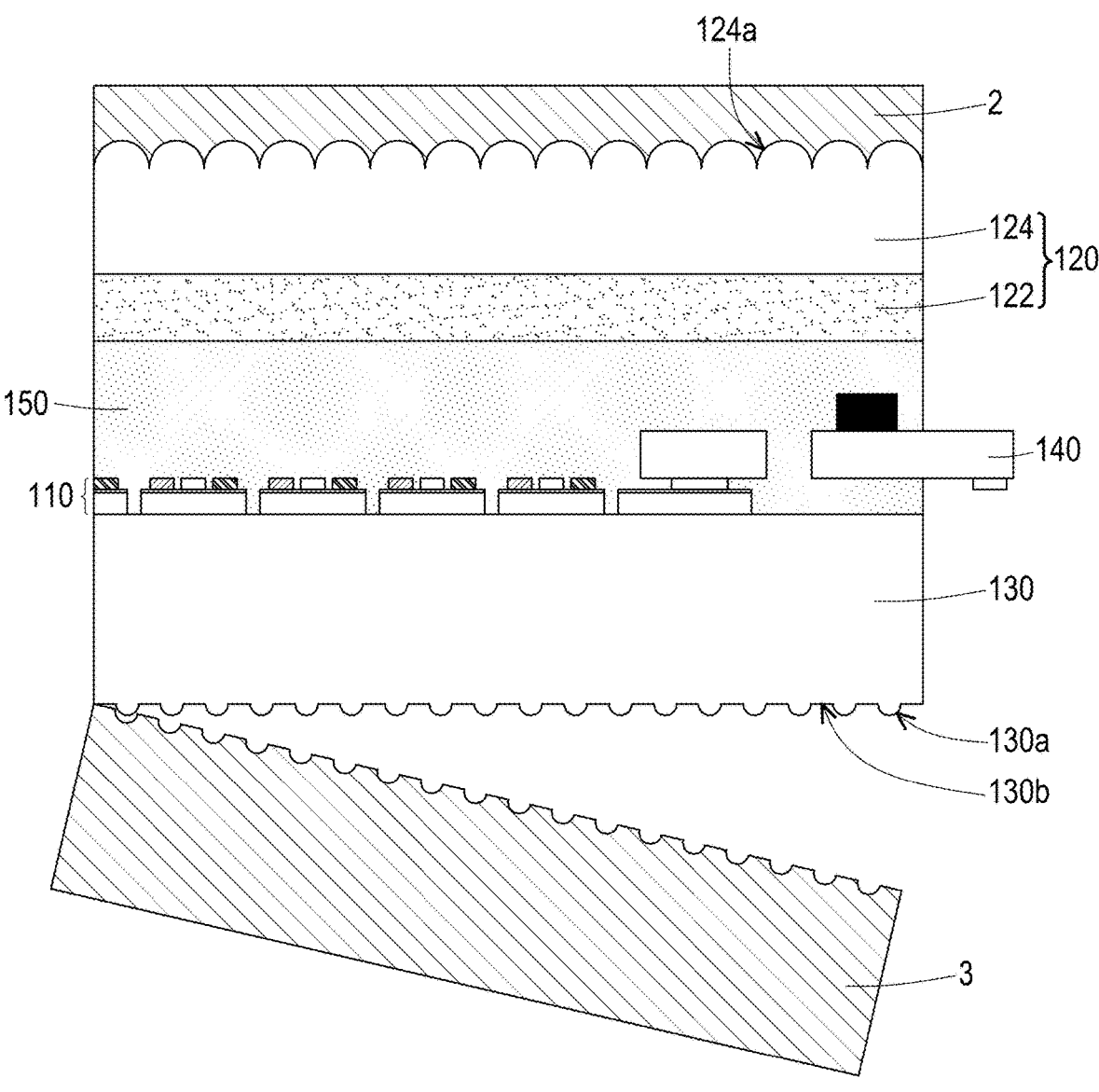
Figure 6F:
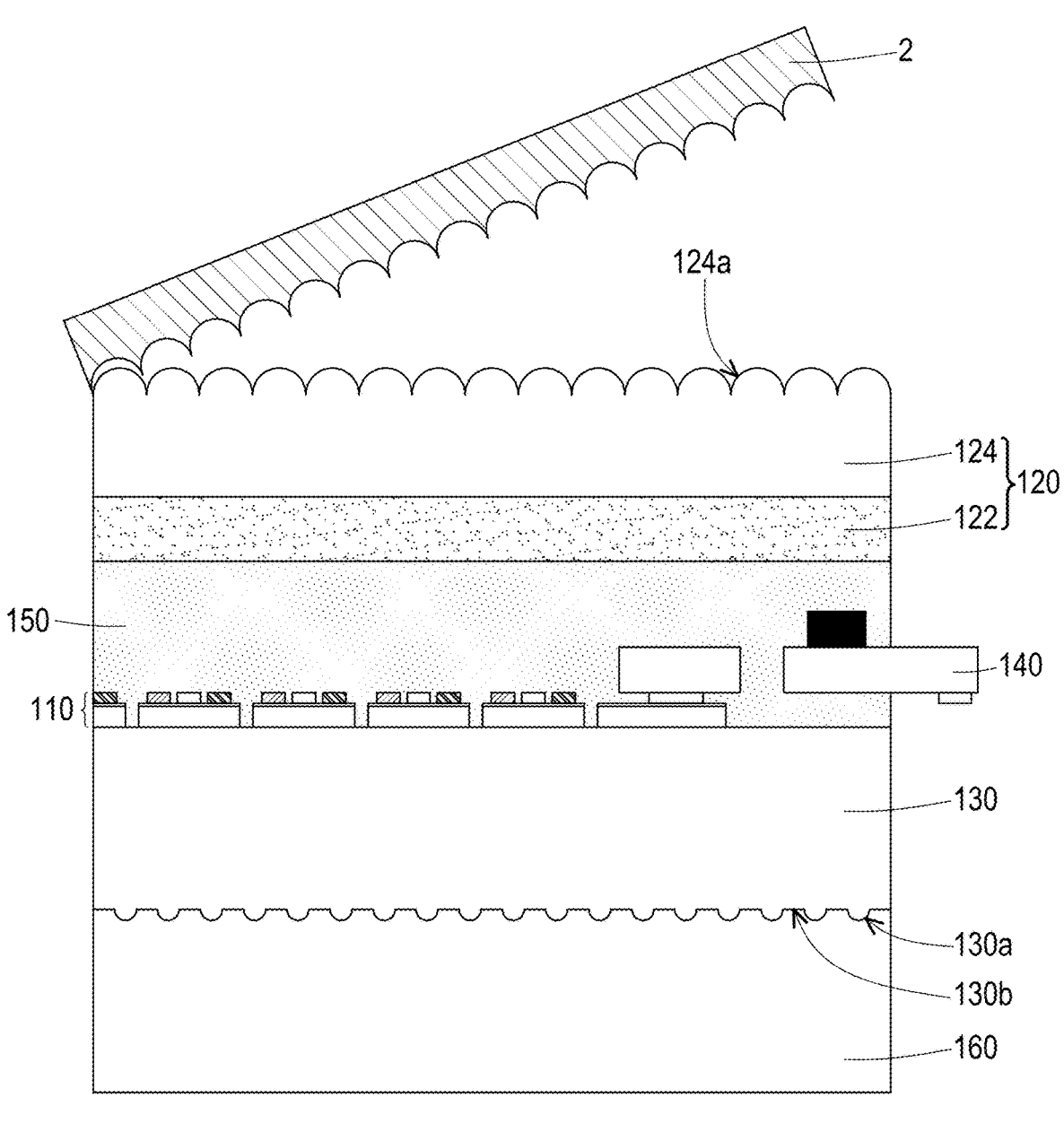
Figure 6G:
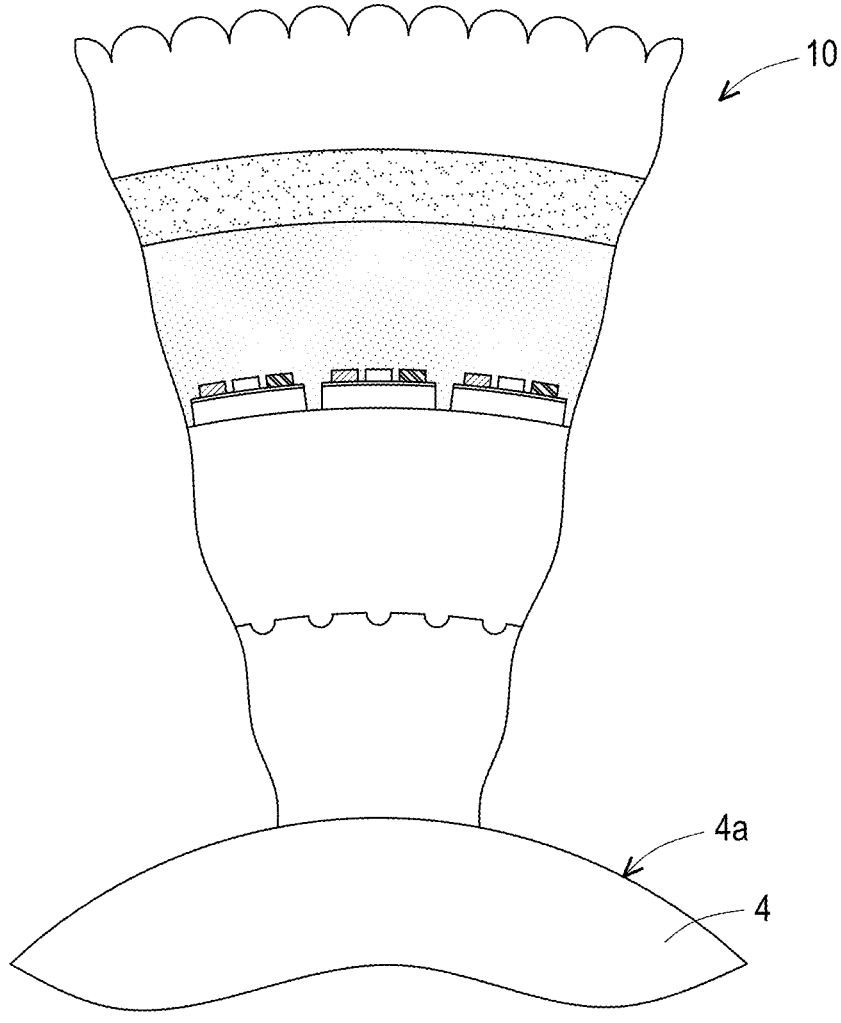

Referring to FIG. 6D, then, a carrier layer 130' is formed on the surface 110*c* of the stretchable electronic component layer 110. The carrier layer 130' is not yet cured, and a texture film 3 is selectively used to form a texture 130*a* on the uncured carrier layer 130'. Referring to FIG. 6D and FIG. 6E, next, a heating process is performed to form a cured carrier layer 130, in which the cured carrier layer 130 is firmly connected with the stretchable electronic component layer 110 and the protective layer 150. Referring to FIG. 6E and FIG. 6F, then, the carrier layer 130 is separated from the texture film 3 to expose the surface 130*b* of the carrier layer 130, and the decorative component layer 120 is separated from the texture film 2. Referring to FIG. 6F, next, the sensing layer 160 is formed on the surface 130*b* of the carrier layer 130, thus completing the electronic device 10. Referring to FIG. 6G, in some embodiments, the electronic device 10 may be assembled onto a curved surface 4*a* of a fixture 4. The curved surface 4*a* may be any type of three-dimensional curved surface.

It should be noted here that the following embodiments continue to use the reference numerals and partial content of the aforementioned embodiments, wherein the same reference numerals are used to represent the same or similar components, and repeated descriptions will be omitted. Please refer to the aforementioned embodiments for the omitted parts, which will not be repeated in the following embodiments.

Figure 7:
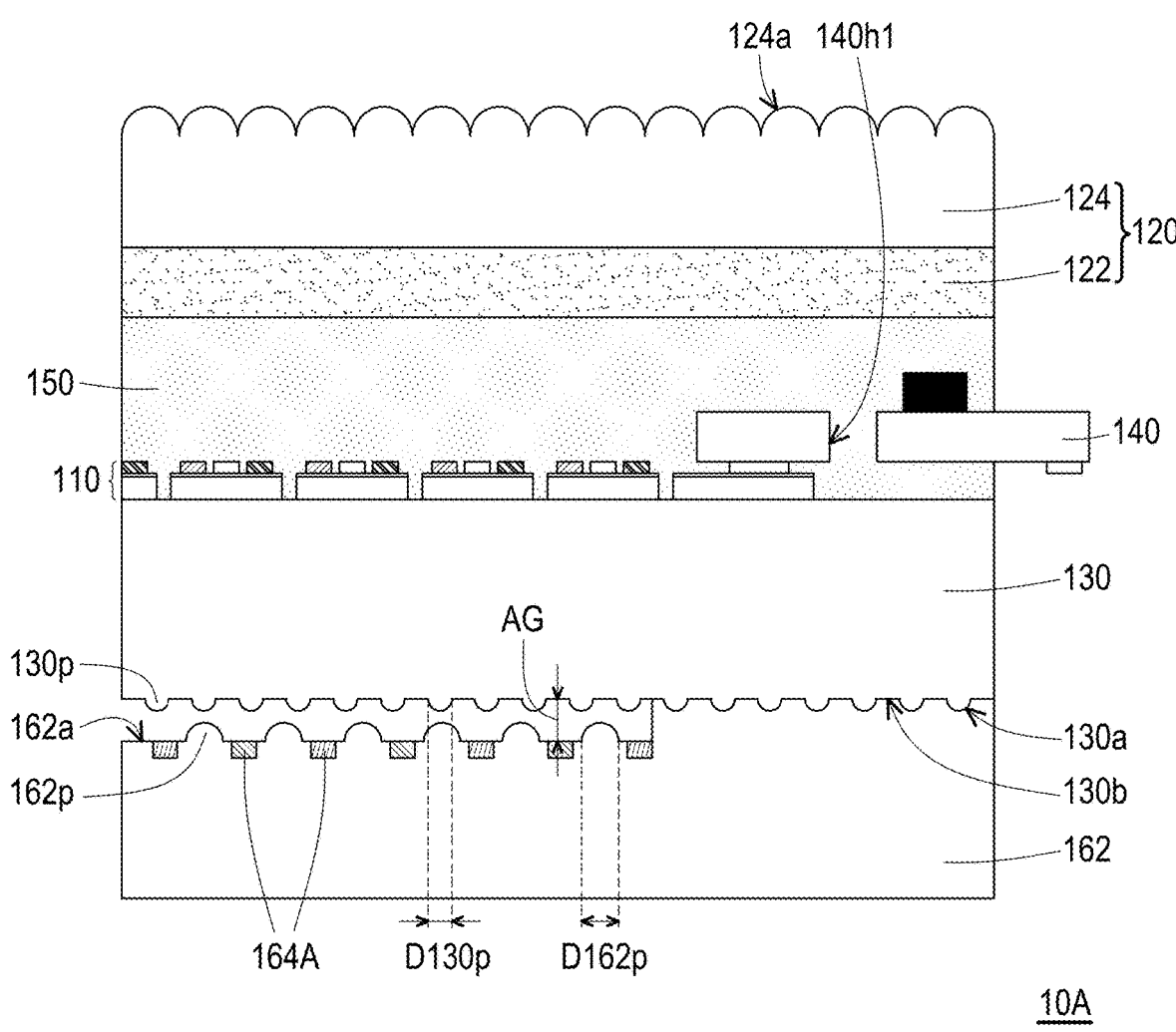
FIG. 7 is a cross-sectional view of an electronic device according to another embodiment of the disclosure.

FIG. 7 is a cross-sectional view of an electronic device according to another embodiment of the disclosure. An electronic device 10A in FIG. 7 is similar to the electronic device 10 in FIG. 2, and FIG. 7 further illustrates the detailed structure of a sensing layer 160A.

Referring to FIG. 7, in this embodiment, an air gap AG may exist between the sensing layer 160A and the carrier layer 130. The sensing layer 160A includes an insulating substrate 162 and an electrode 164A disposed on the insulating substrate 162. In this embodiment, the surface impedance of the carrier layer 130 may fall in a range of $10^4$ Ω/sq to $10^9$ Ω/sq, which means that the carrier layer 130 is of electrostatic dissipative grade. For example, in this embodiment, the material of the carrier layer 130 is stretchable electrostatic dissipative grade silicone, but the disclosure is not limited thereto. In this embodiment, the surface impedance of the decorative component layer 120, the protective layer 150, and the insulating substrate 162 is greater than $10^{12}$ Ω/sq.

Figure 8:
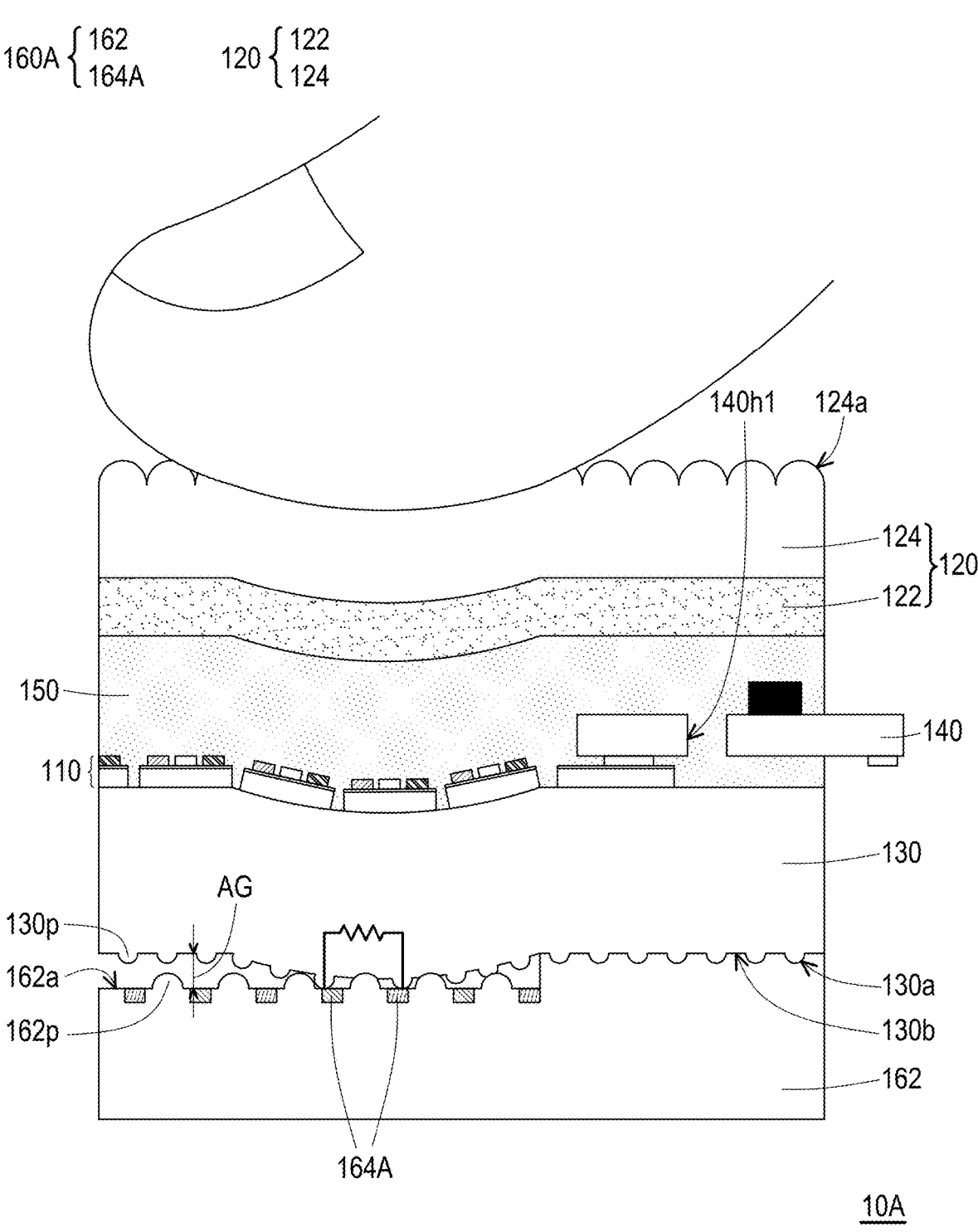
FIG. 8 illustrates a state of the electronic device in FIG. 7 when pressed.

FIG. 8 illustrates a state of the electronic device in FIG. 7 when pressed. Referring to FIG. 7 and FIG. 8, in this embodiment, the electrode 164A may be selectively exposed by the insulating substrate 162. When the electronic device 10 is pressed, the carrier layer 130 may come into contact with the electrode 164A of the sensing layer 160A to form a circuit, thereby implementing a touch function. That is to say, in this embodiment, the carrier layer 130 and the sensing layer 160A may form a touch part of the electronic device 10A, and the touch part may be of resistive type.

In this embodiment, the surface 130b of the carrier layer 130 facing the sensing layer 160A may selectively have multiple first micro-protrusions 130p. The surface 162a of the insulating substrate 162 facing the carrier layer 130 may selectively have multiple second micro-protrusions 162p. A dimension D130p (indicated in FIG. 7) of the first micro-protrusion 130p may be smaller than a dimension D162p (indicated in FIG. 7) of the second micro-protrusion 162p. The smaller first micro-protrusions 130p may provide contact area variation, increase the degree of impedance change, and thereby enhance the sensitivity of the touch part of the electronic device 10A. The shape is not necessarily hemispherical. Any geometric shape that can provide contact area variation is acceptable, such as the rough surface of matte silicone rubber, but FIG. 7 illustrates the first micro-protrusions 130p in a hemispherical shape. The larger second micro-protrusions 162p may be used as a gap layer.

Figure 9:
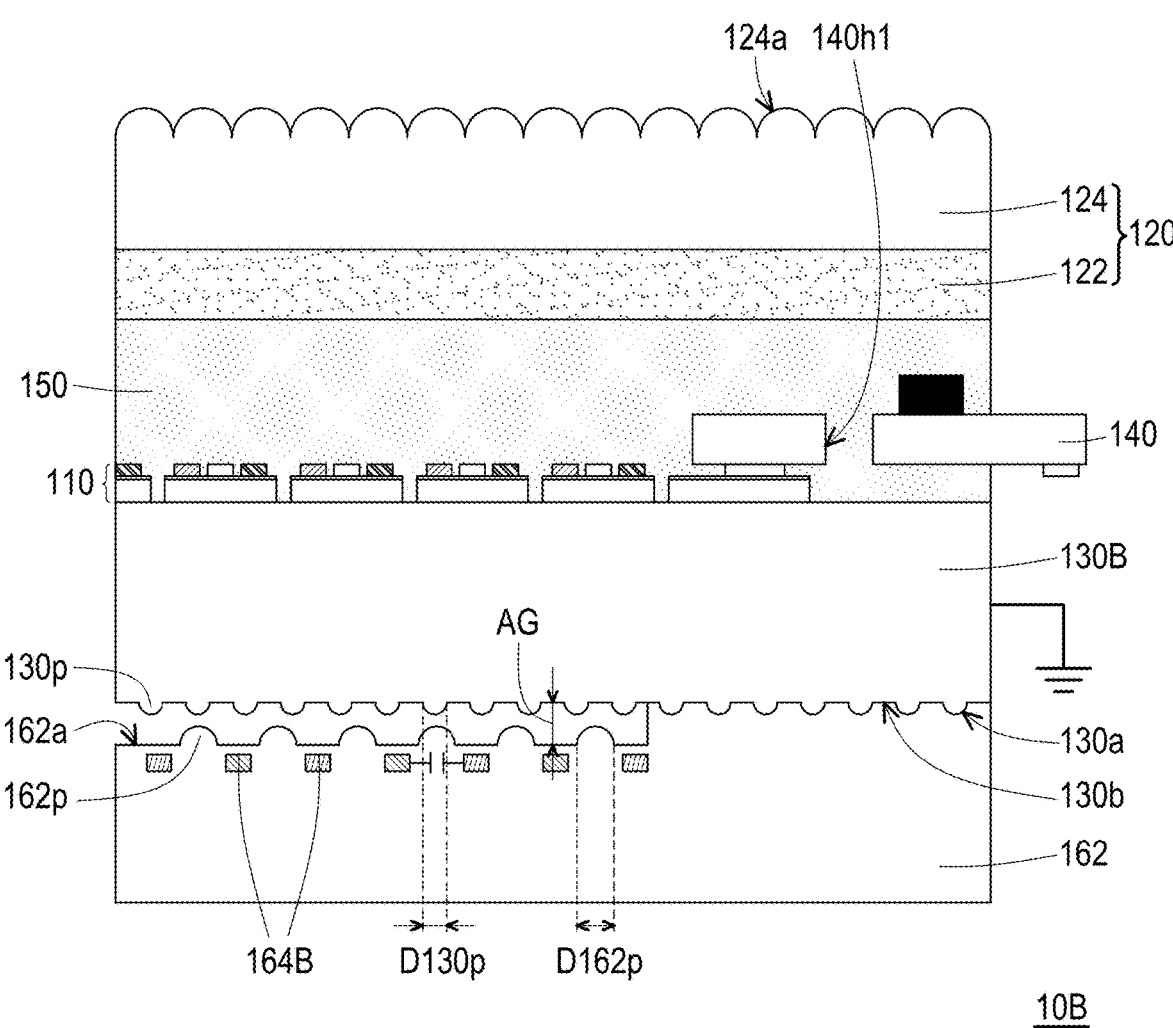
FIG. 9 is a cross-sectional view of an electronic device according to yet another embodiment of the disclosure.

FIG. 9 is a cross-sectional view of an electronic device according to yet another embodiment of the disclosure. An electronic device 10B in FIG. 9 is similar to the electronic device 10A in FIG. 7, with the difference being that: in the embodiment of FIG. 9, the surface impedance of a carrier layer 130B falls in a range of $10^{-3}$ Ω/sq to $10^3$ Ω/sq, which means that the carrier layer 130B is of conductive grade. In the embodiment of FIG. 9, the carrier layer 130B may be grounded.

Figure 10:
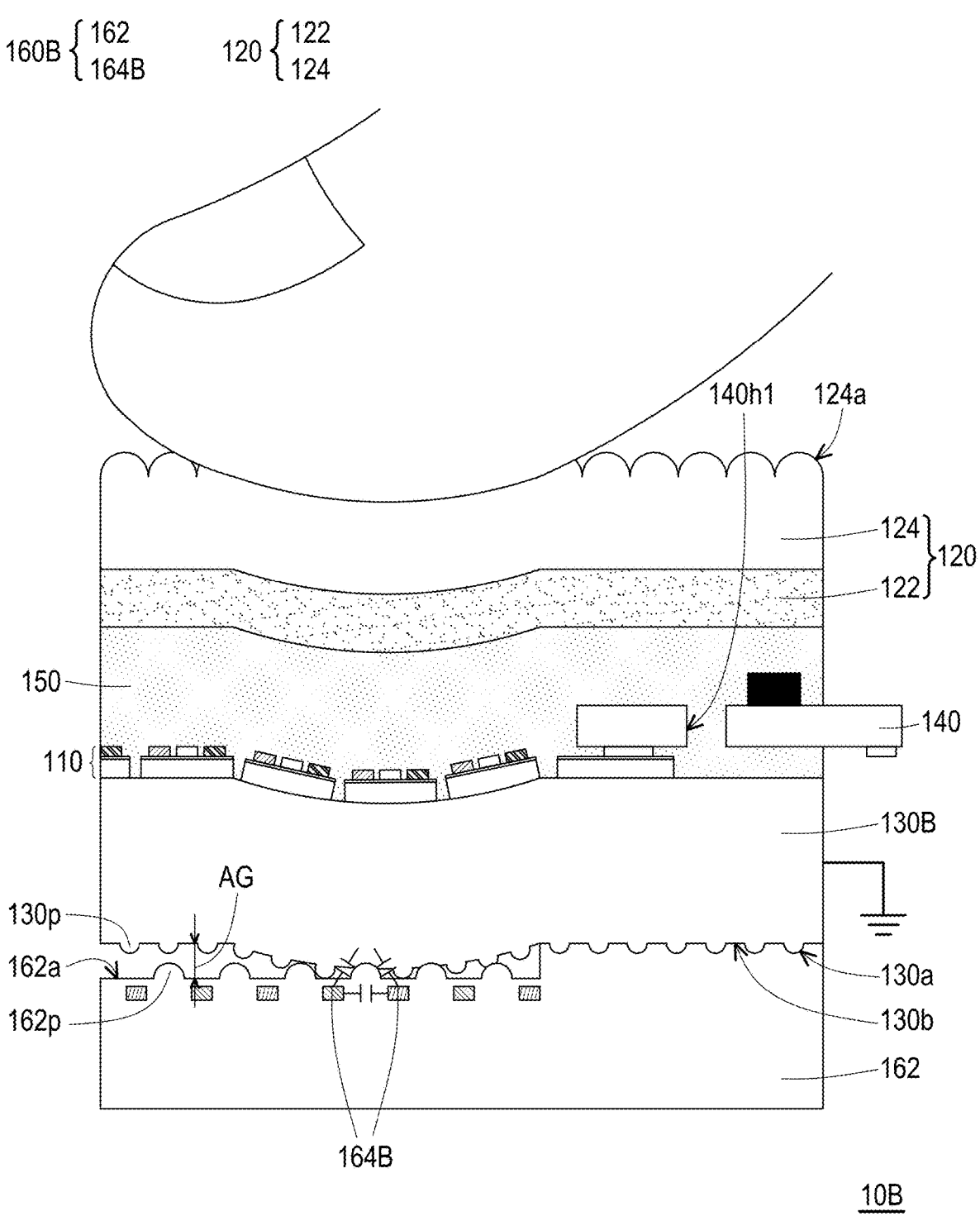
FIG. 10 illustrates a state of the electronic device in FIG. 9 when pressed.

FIG. 10 illustrates a state of the electronic device in FIG. 9 when pressed. Referring to FIG. 9 and FIG. 10, when the electronic device 10 is pressed, capacitance change may occur between the carrier layer 130B and the electrode 164B, thereby implementing a touch function. That is to say, in this embodiment, the carrier layer 130B and the sensing layer 160B may form a touch part of the electronic device 10B, and the touch part may be of capacitive type. In this embodiment, the electrode 164B may be embedded in the insulating substrate 162 without being exposed to prevent a short circuit. In this embodiment, the insulating substrate 162 may use a material with a high dielectric constant to increase the amount of capacitance change.

Figure 11:
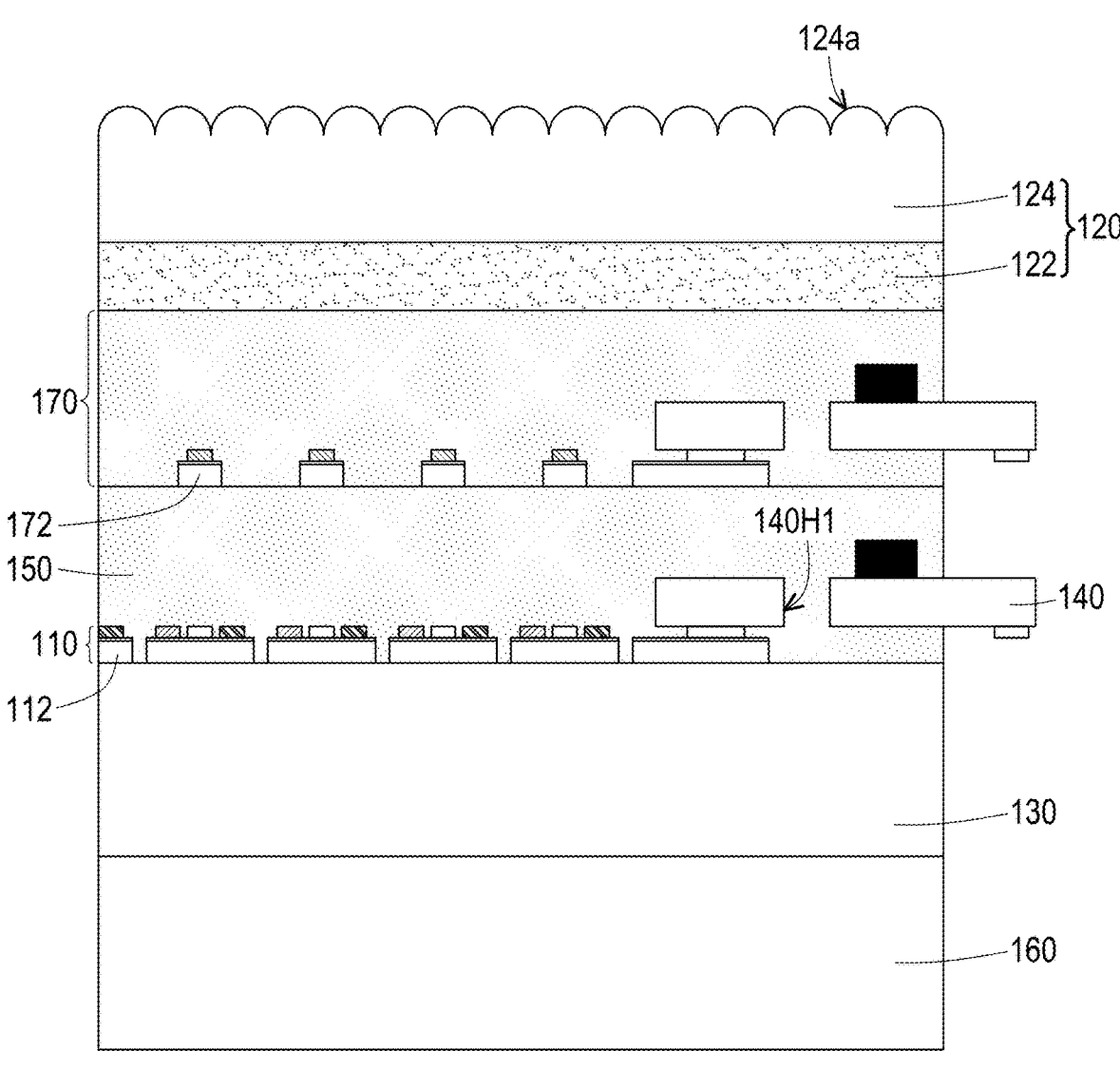
FIG. 11 is a cross-sectional view of an electronic device according to yet another embodiment of the disclosure.

FIG. 11 is a cross-sectional view of an electronic device according to yet another embodiment of the disclosure. Referring to FIG. 11, an electronic device 10C in FIG. 11 is similar to the electronic device 10 in FIG. 2, with the difference being that: in the embodiment of FIG. 11, in addition to the sensing layer 160 disposed on one side of the carrier layer 130, the electronic device 10C further includes a sensing layer 170 disposed on the other side of the carrier layer 130, thereby forming a double-sided touch control.

Figure 12:
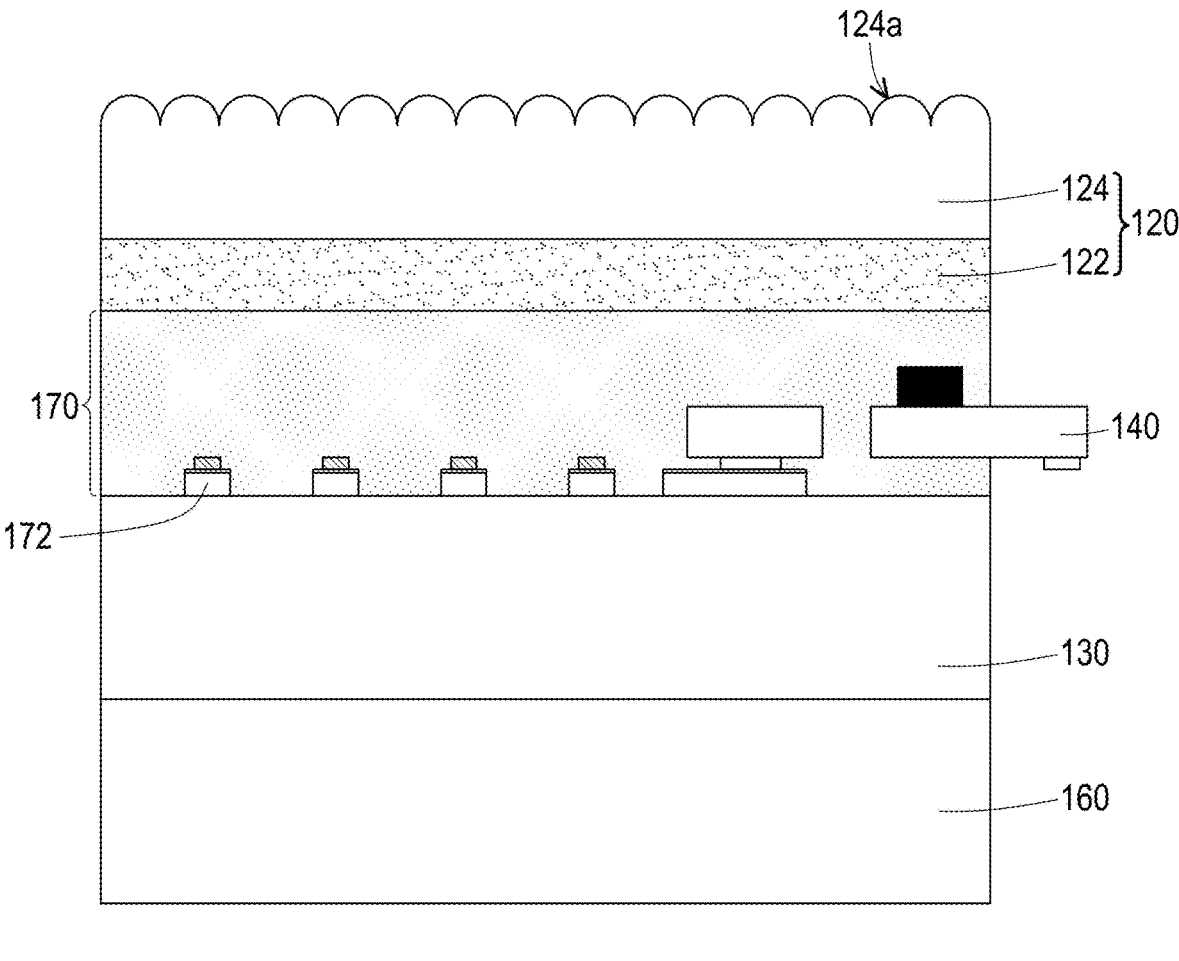
FIG. 12 is a cross-sectional view of an electronic device according to an embodiment of the disclosure.

FIG. 12 is a cross-sectional view of an electronic device according to an embodiment of the disclosure. Referring to FIG. 12, an electronic device 10D in FIG. 12 is similar to the electronic device 10C in FIG. 11, with the difference being that: in the embodiment of FIG. 12, the electronic device 10D may omit the stretchable electronic component layer 110, the protective layer 150, and the flexible electronic component 140, which means that the display stack structure may be omitted.

Figure 13:
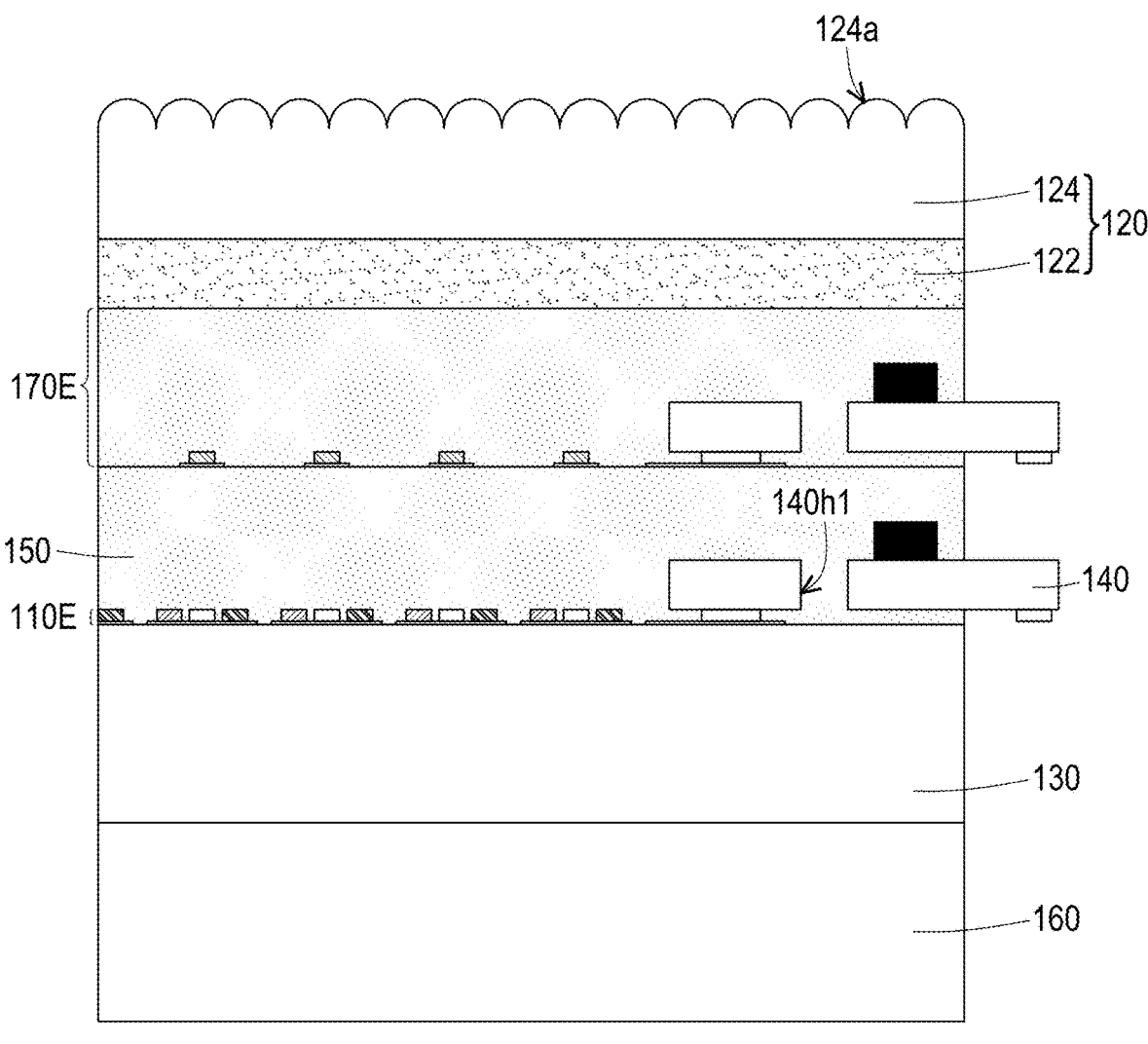
FIG. 13 is a cross-sectional view of an electronic device according to another embodiment of the disclosure.

FIG. 13 is a cross-sectional view of an electronic device according to another embodiment of the disclosure. Referring to FIG. 13, an electronic device 10E in FIG. 13 is similar to the electronic device 10C in FIG. 11, with the difference being that: in the embodiment of FIG. 13, a sensing layer 170E and a stretchable electronic component layer 110E may respectively omit a stretchable substrate 172 of the sensing layer 170 and the stretchable substrate 112 of the stretchable electronic component layer 110 in FIG. 11.

Figure 14:
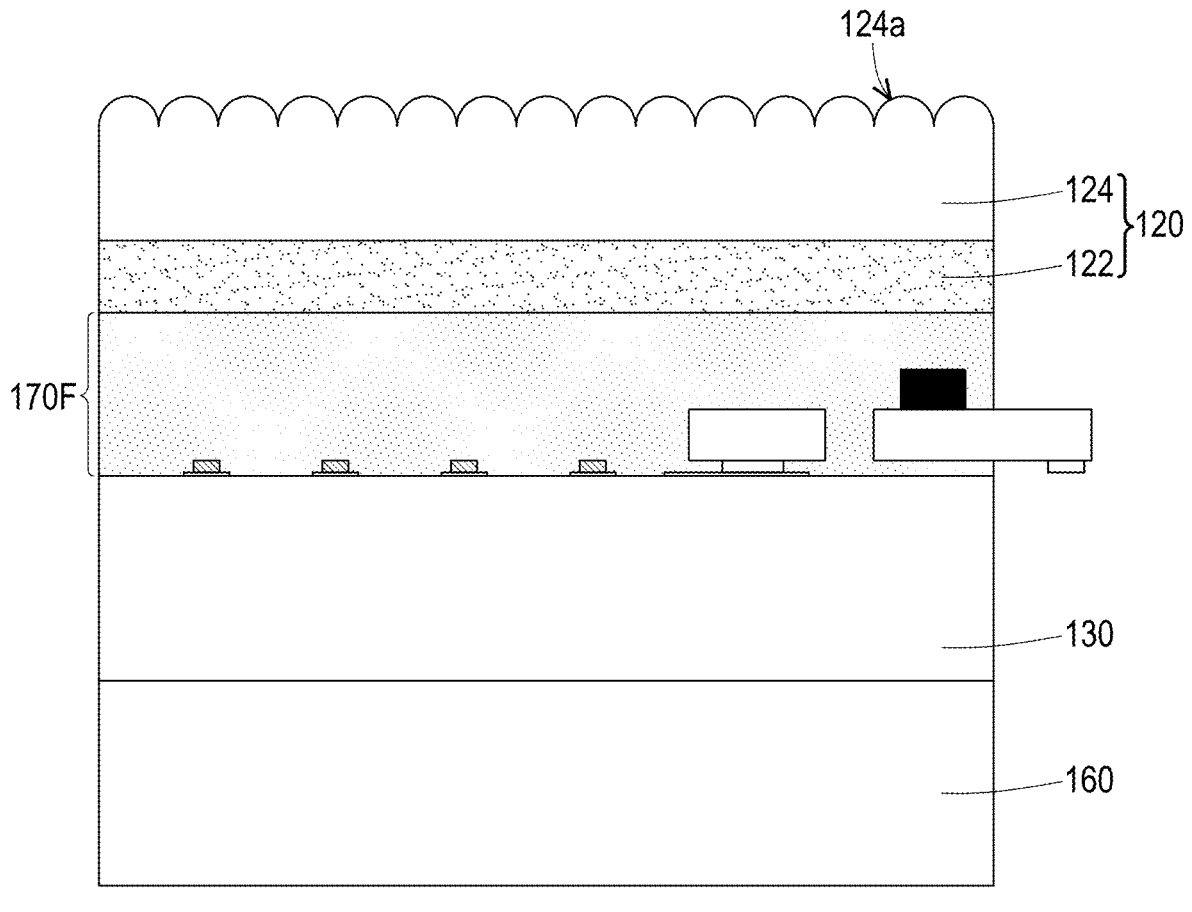
FIG. 14 is a cross-sectional view of an electronic device according to yet another embodiment of the disclosure.

FIG. 14 is a cross-sectional view of an electronic device according to yet another embodiment of the disclosure. Referring to FIG. 14, an electronic device 10F in FIG. 14 is similar to the electronic device 10D in FIG. 12, with the difference being that: in the embodiment of FIG. 14, a sensing layer 170F may omit the stretchable substrate 172 of the sensing layer 170 in FIG. 12.

Figure 15:
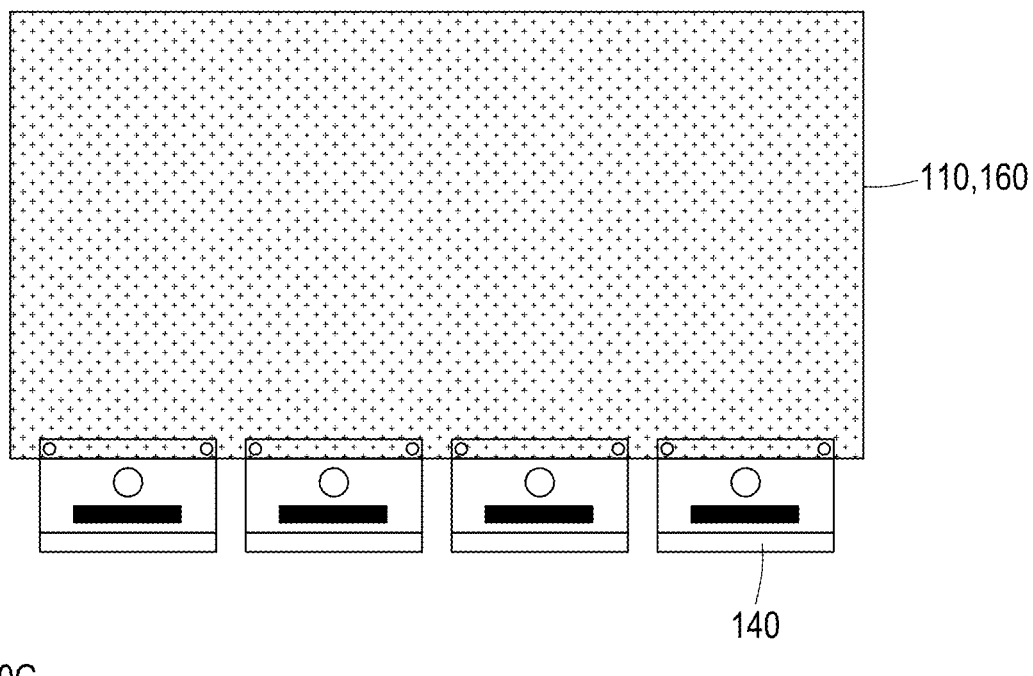
FIG. 15 is a top view of an electronic device according to yet another embodiment of the disclosure with the internal structure visible.
Figure 16:
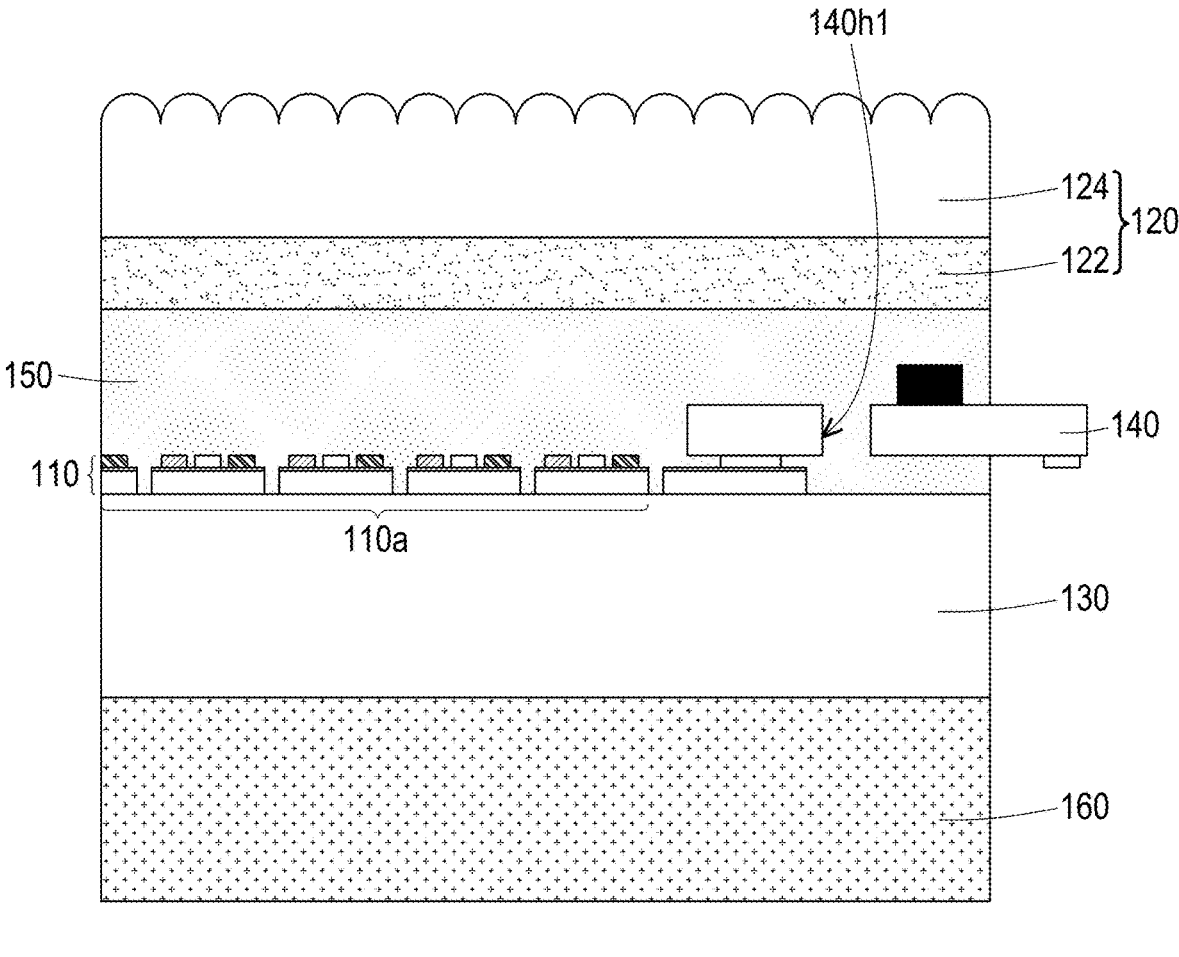
FIG. 16 is a cross-sectional view of the electronic device in FIG. 15.

FIG. 15 is a top view of an electronic device according to yet another embodiment of the disclosure with the internal structure visible. FIG. 16 is a cross-sectional view of the electronic device in FIG. 15. Referring to FIG. 15 and FIG. 16, in this embodiment, the range of the sensing layer 160 of an electronic device 10G may be larger than or equal to the range of the working area 110a of the stretchable electronic component layer 110.

Figure 17:
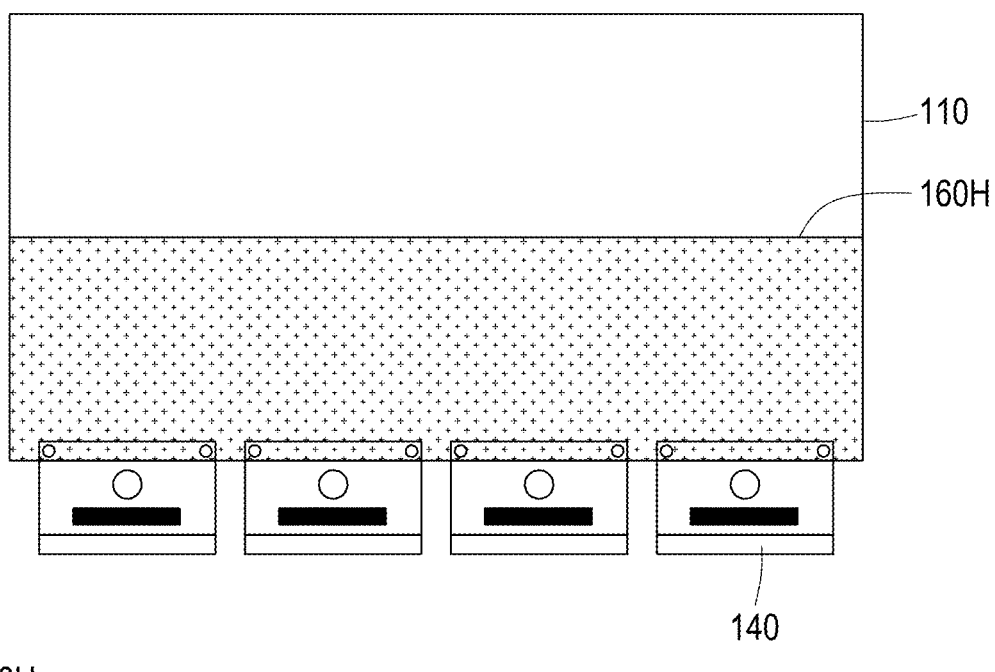
FIG. 17 is a top view of an electronic device according to yet another embodiment of the disclosure with the internal structure visible.
Figure 18:
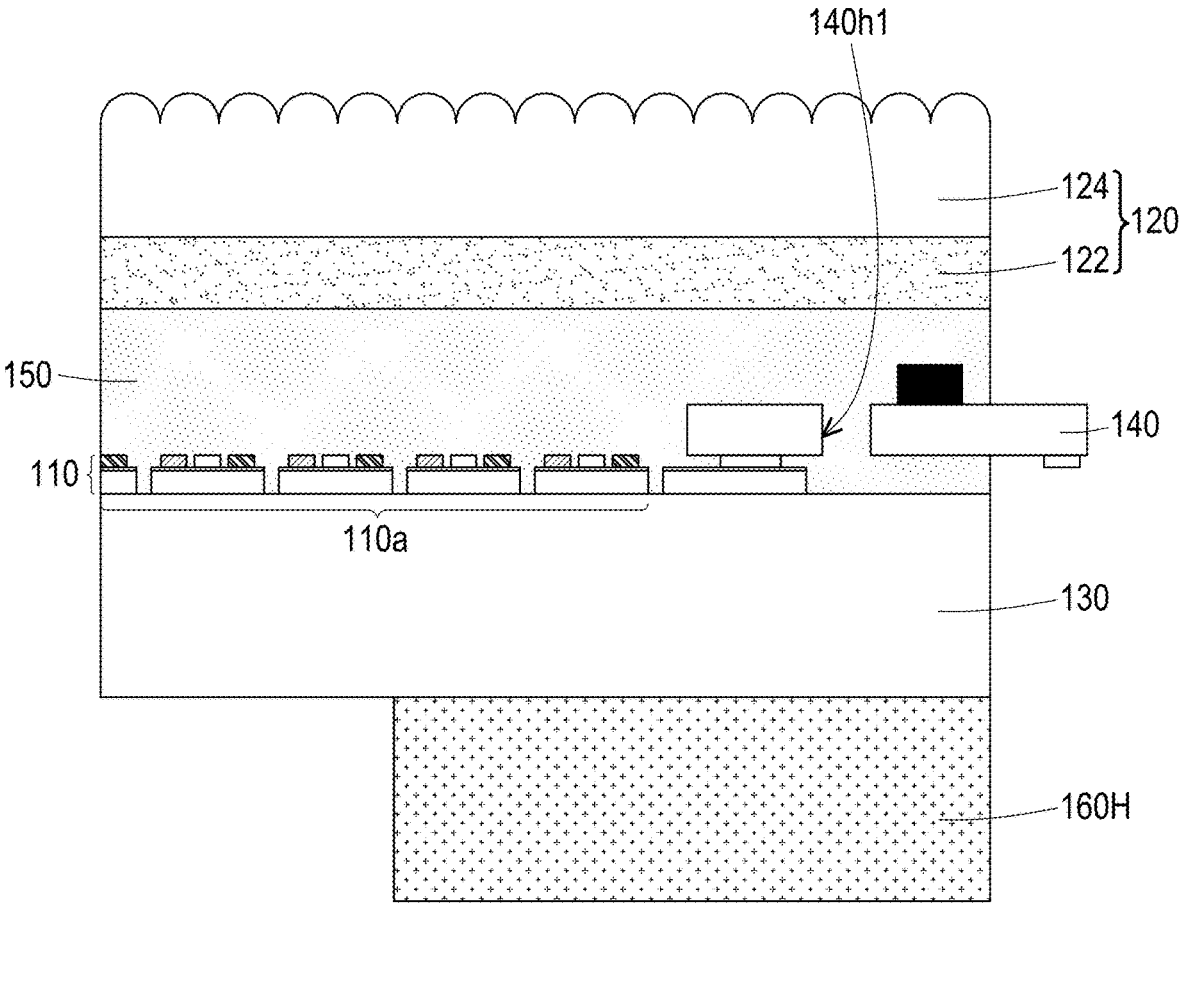
FIG. 18 is a cross-sectional view of the electronic device in FIG. 17.

FIG. 17 is a top view of an electronic device according to yet another embodiment of the disclosure with the internal structure visible. FIG. 18 is a cross-sectional view of the electronic device in FIG. 17. Referring to FIG. 17 and FIG. 18, in this embodiment, the range of a sensing layer 160H of an electronic device 10H may be smaller than the range of the working area 110a of the stretchable electronic component layer 110. In this embodiment, a part of the electronic device 10H may have a sensing function, and a part of the electronic device 10H may have a transparent display function.

Figure 19:
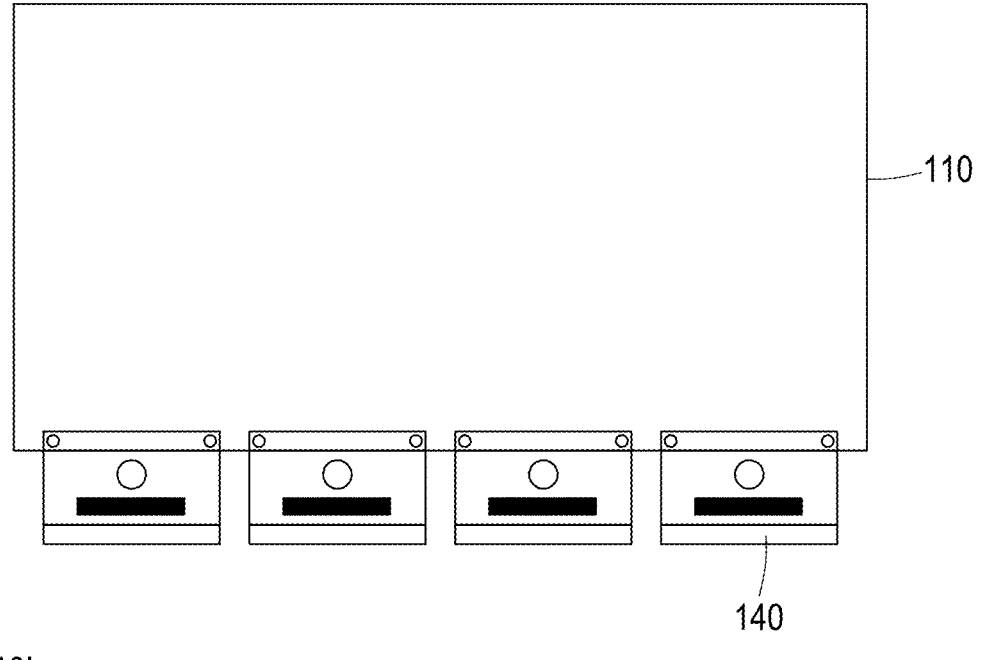
FIG. 19 is a top view of an electronic device according to an embodiment of the disclosure with the internal structure visible.
Figure 20:
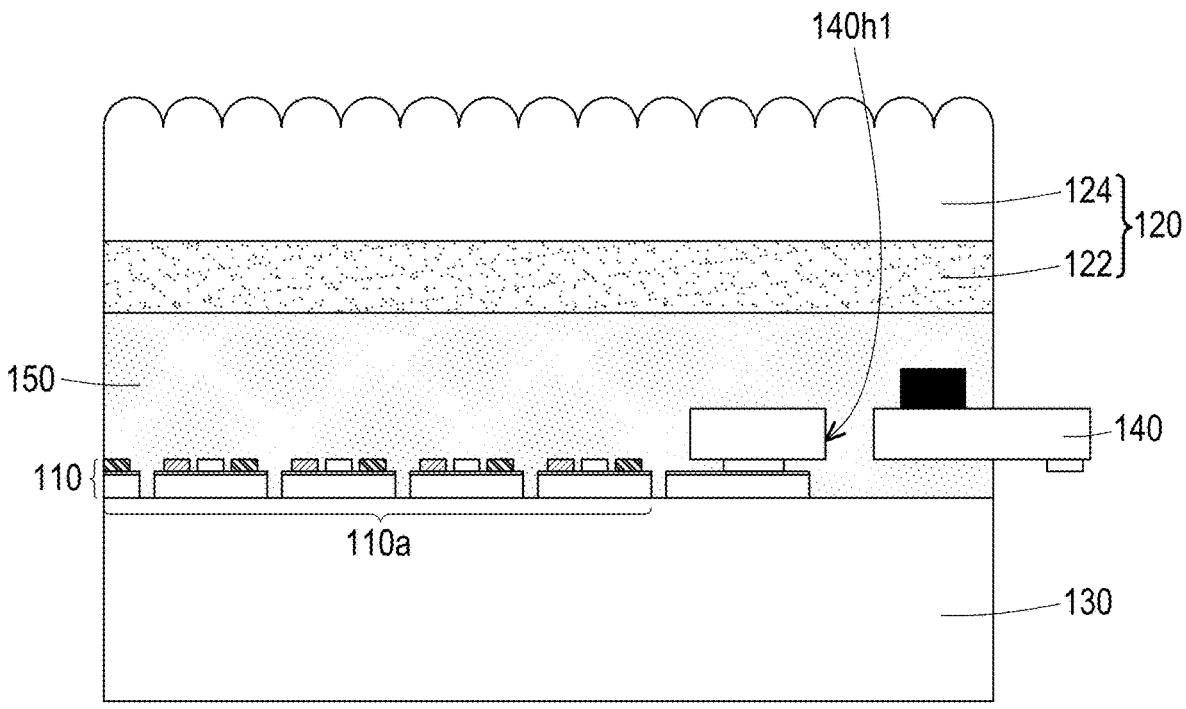
FIG. 20 is a cross-sectional view of the electronic device in FIG. 19.

FIG. 19 is a top view of an electronic device according to an embodiment of the disclosure with the internal structure visible. FIG. 20 is a cross-sectional view of the electronic device in FIG. 19. Referring to FIG. 19 and FIG. 20, in this embodiment, an electronic device 10I may omit the sensing layer.

What is claimed is:

1. An electronic device, comprising:
a stretchable electronic component layer; and
a decorative component layer, comprising:
    a first sub-layer disposed on the stretchable electronic component layer; and
    a second sub-layer disposed on the first sub-layer, wherein the first sub-layer is located between the second sub-layer and the stretchable electronic component layer, the second sub-layer has a decorative texture, and a transmittance of the first sub-layer is less than a transmittance of the second sub-layer.

2. The electronic device as claimed in claim 1, wherein a color of the first sub-layer and a color of the second sub-layer of the decorative component layer are different.

3. The electronic device as claimed in claim 1, wherein the transmittance of the first sub-layer of the decorative component layer falls in a range of 10% to 40%.

4. The electronic device as claimed in claim 1, wherein the transmittance of the second sub-layer of the decorative component layer is greater than 80%.

5. The electronic device as claimed in claim 1, wherein a thickness of the first sub-layer of the decorative component layer is K, a thickness of the second sub-layer of the decorative component layer is J, and K≤J.

6. The electronic device as claimed in claim 1, wherein the second sub-layer of the decorative component layer has a surface facing away from the stretchable electronic component layer, the decorative texture is formed on the surface, the surface has a height difference, the height difference is F, a thickness of the second sub-layer of the decorative component layer is J, and 2F≤J≤10F.

7. The electronic device as claimed in claim 1, further comprising:

a carrier layer, wherein the stretchable electronic component layer is disposed on the carrier layer, and the stretchable electronic component layer is located between the decorative component layer and the carrier layer;

a flexible electronic component bonded to a bonding area of the stretchable electronic component layer; and a protective layer disposed on the carrier layer, and covering the stretchable electronic component layer and a part of the flexible electronic component, wherein the protective layer is located between the decorative component layer and the stretchable electronic component layer and between the decorative component layer and the flexible electronic component, wherein a thickness of the protective layer is B, a thickness of a flexible substrate of the flexible electronic component is E, and B≥2E.

8. The electronic device as claimed in claim 1, further comprising:

a carrier layer, wherein the stretchable electronic component layer is disposed on the carrier layer, and the stretchable electronic component layer is located between the decorative component layer and the carrier layer;

a flexible electronic component bonded to a bonding area of the stretchable electronic component layer, wherein the flexible electronic component has a first perforation, and the first perforation is located outside the bonding area of the stretchable electronic component layer; and a protective layer disposed on the carrier layer, and covering the stretchable electronic component layer and a part of the flexible electronic component, wherein the protective layer is located between the decorative component layer and the stretchable electronic component layer and between the decorative component layer and the flexible electronic component, wherein a part of the protective layer fills into the first perforation of the flexible electronic component and connects with the carrier layer.

9. The electronic device as claimed in claim 1, further comprising:

a carrier layer, wherein the stretchable electronic component layer is disposed on the carrier layer, and the stretchable electronic component layer is located between the decorative component layer and the carrier layer;

a flexible electronic component bonded to a bonding area of the stretchable electronic component layer, wherein the flexible electronic component has a second perforation, the bonding area of the stretchable electronic component layer has a bonding area perforation, and the second perforation of the flexible electronic component and the bonding area perforation of the stretchable electronic component layer are disposed correspondingly to each other; and a protective layer disposed on the carrier layer, and covering the stretchable electronic component layer and a part of the flexible electronic component, wherein the protective layer is located between the decorative component layer and the stretchable electronic component layer and between the decorative component layer and the flexible electronic component, wherein a part of the protective layer fills into the second perforation of the flexible electronic component and the bonding area perforation of the stretchable electronic component layer, and connects with the carrier layer.

10. The electronic device as claimed in claim 1, wherein a working area of the stretchable electronic component layer has a working area perforation, and the electronic device further comprises:

a carrier layer, wherein the stretchable electronic component layer is disposed on the carrier layer, and the stretchable electronic component layer is located between the decorative component layer and the carrier layer; and a protective layer disposed on the carrier layer, and covering the stretchable electronic component layer, wherein the protective layer is located between the decorative component layer and the stretchable electronic component layer, wherein a part of the protective layer fills into the working area perforation of the stretchable electronic component layer and connects with the carrier layer.

11. The electronic device as claimed in claim 1, further comprising:

a carrier layer, wherein the stretchable electronic component layer is disposed on the carrier layer, and the stretchable electronic component layer is located between the decorative component layer and the carrier layer; and a sensing layer, wherein the carrier layer is located between the stretchable electronic component layer and the sensing layer, wherein an air gap exists between the sensing layer and the carrier layer.

12. The electronic device as claimed in claim 11, wherein a surface of the carrier layer facing the sensing layer has a plurality of first micro-protrusions.

13. The electronic device as claimed in claim 12, wherein the sensing layer comprises an insulating substrate, and a surface of the insulating substrate facing the carrier layer has a plurality of second micro-protrusions.

14. The electronic device as claimed in claim 13, wherein a dimension of the first micro-protrusion of the carrier layer is smaller than a dimension of the second micro-protrusion of the sensing layer.

15. The electronic device as claimed in claim 11, wherein the sensing layer comprises an insulating substrate and an electrode disposed on the insulating substrate, and a surface impedance of the carrier layer falls in a range of $10^4$ Ω/sq to $10^9$ Ω/sq.

16. The electronic device as claimed in claim 1, wherein the sensing layer comprises an insulating substrate and an electrode embedded in the insulating substrate, and a surface impedance of the carrier layer falls in a range of $10^{-3}$ Ω/sq to $10^3$ Ω/sq.

17. An electronic device, comprising:

a stretchable electronic component layer;

a decorative component layer disposed on the stretchable electronic component layer;

a carrier layer, wherein the stretchable electronic component layer is disposed on the carrier layer, and the stretchable electronic component layer is located between the decorative component layer and the carrier layer;

a flexible electronic component bonded to a bonding area of the stretchable electronic component layer, wherein the flexible electronic component has a first perforation, and the first perforation is located outside the bonding area of the stretchable electronic component layer; and a protective layer disposed on the carrier layer, and covering the stretchable electronic component layer and a part of the flexible electronic component, wherein the protective layer is located between the decorative component layer and the stretchable electronic component layer and between the decorative component layer and the flexible electronic component, wherein a part of the protective layer fills into the first perforation of the flexible electronic component and connects with the carrier layer.

* * * * *